(12) United States Patent
Yoshimura et al.

(10) Patent No.: US 11,631,683 B2
(45) Date of Patent: Apr. 18, 2023

(54) SEMICONDUCTOR STORAGE DEVICE

(71) Applicant: Kioxia Corporation, Tokyo (JP)

(72) Inventors: Naoya Yoshimura, Kuwana Mie (JP); Keisuke Nakatsuka, Kobe Hyogo (JP)

(73) Assignee: KIOXIA CORPORATION, Tokyo (JP)

( * ) Notice: Subject to any disclaimer, the term of this patent is extended or adjusted under 35 U.S.C. 154(b) by 271 days.

(21) Appl. No.: 17/011,006

(22) Filed: Sep. 3, 2020

(65) Prior Publication Data
US 2021/0296331 A1 Sep. 23, 2021

(30) Foreign Application Priority Data
Mar. 23, 2020 (JP) .............................. JP2020-051004

(51) Int. Cl.
| | | |
|---|---|---|
| H01L 27/11582 | (2017.01) | |
| H01L 27/11519 | (2017.01) | |
| H01L 27/11565 | (2017.01) | |
| G11C 16/04 | (2006.01) | |
| H01L 27/11556 | (2017.01) | |

(52) U.S. Cl.
CPC ............... *H01L 27/11519* (2013.01); *H01L 27/11565* (2013.01); *G11C 16/0483* (2013.01); *H01L 27/11556* (2013.01); *H01L 27/11582* (2013.01)

(58) Field of Classification Search
CPC ................................................ H01L 27/11582
See application file for complete search history.

(56) References Cited

U.S. PATENT DOCUMENTS

2017/0271348 A1 9/2017 Arai et al.
2017/0309634 A1* 10/2017 Noguchi ........... H01L 27/11524

* cited by examiner

*Primary Examiner* — Christopher A Johnson
(74) *Attorney, Agent, or Firm* — Foley & Lardner LLP

(57) ABSTRACT

A semiconductor storage device includes first conductive layers stacked in a first direction and extend in a second direction; second conductive layers stacked in the first direction and extend in the second direction; third conductive layers that are electrically connected to the first conductive layers and the second conductive layers and stacked in the first direction; a first insulating layer and a second insulating layer sandwich the first conductive layer; a third insulating layer and a fourth insulating layer sandwich the second conductive layer; first pillars arranged in the second direction in the first insulating layer with a first distance; and second pillars arranged in the second direction in the second insulating layer with the first distance. Each of the second pillars is displaced from a corresponding one of the first pillars by a second distance that is shorter than a half of the first distance in the second direction.

19 Claims, 15 Drawing Sheets

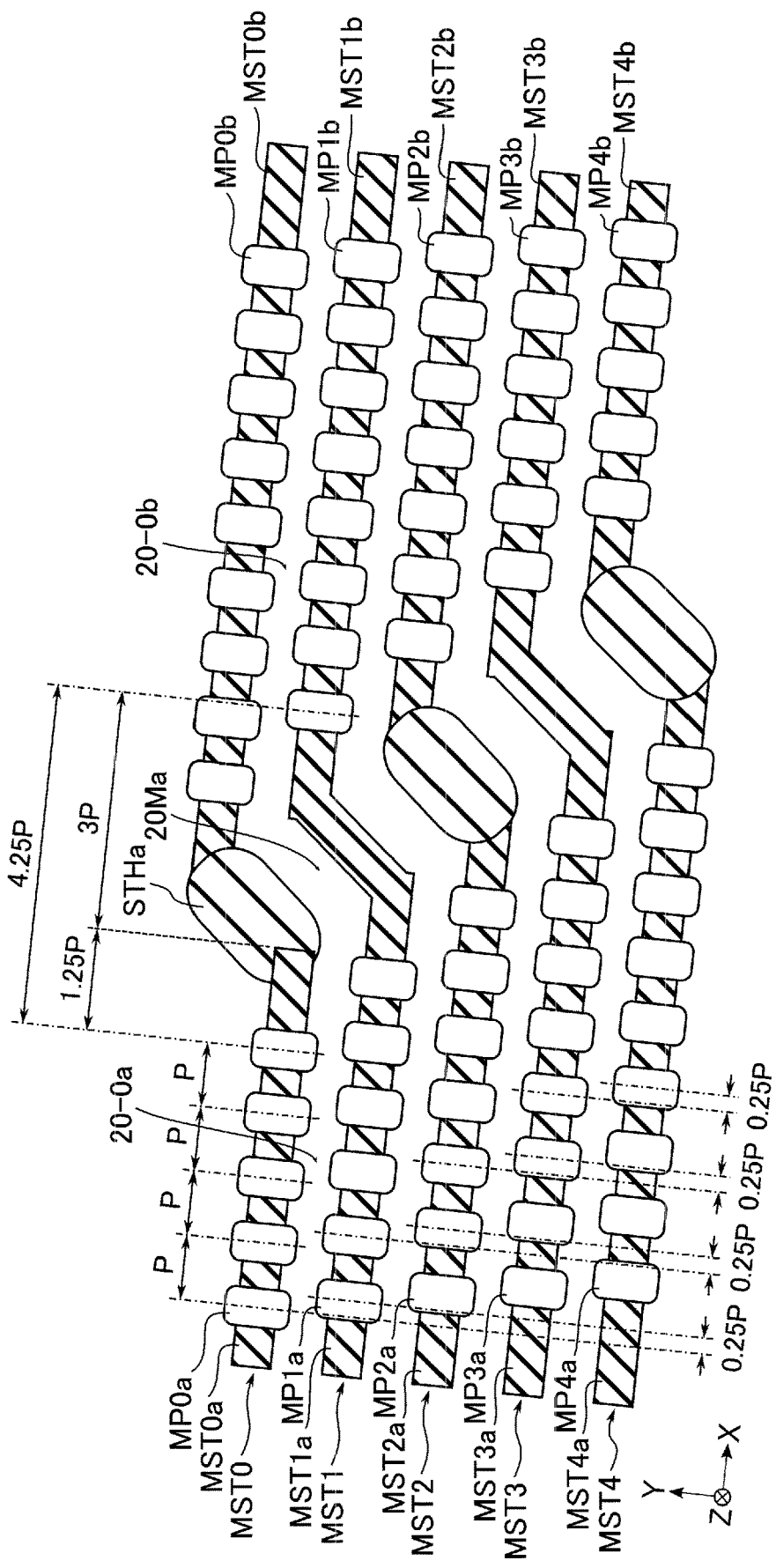

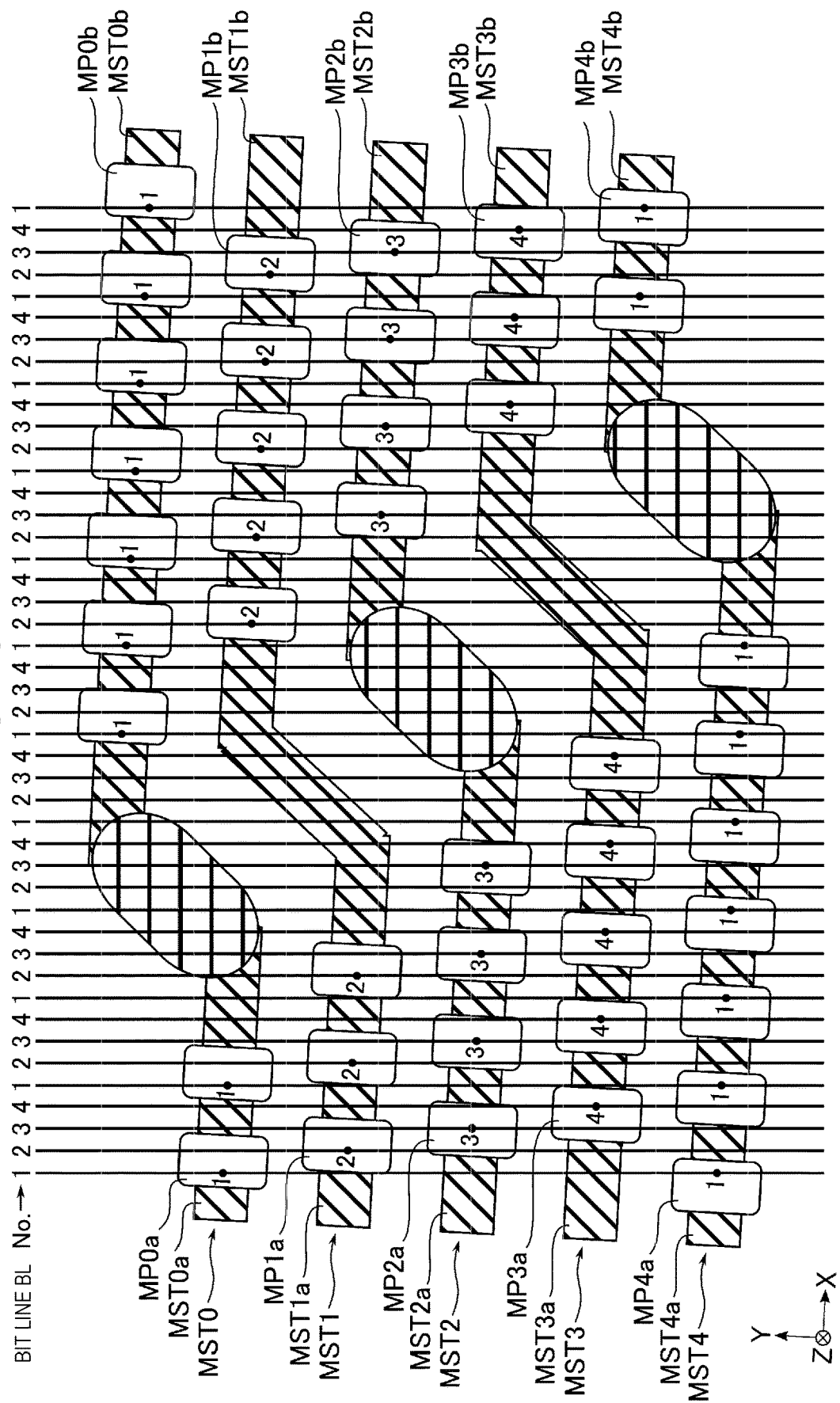

SEMICONDUCTOR STORAGE DEVICE

CROSS-REFERENCE TO RELATED APPLICATION(S)

This application is based upon and claims the benefit of priority from Japanese Patent Application No. 2020-051004, filed Mar. 23, 2020, the entire contents of which are incorporated herein by reference.

FIELD

Embodiments described herein relate generally to a semiconductor storage device.

BACKGROUND

A semiconductor storage device in which memory cells are arranged three-dimensionally is known.

DESCRIPTION OF THE DRAWINGS

FIG. 14 is a diagram showing a memory pillar disposed in a memory trench of the memory array region according to the second embodiment.

FIG. 15 is a diagram showing a bit line connected to the memory pillar of the memory array region according to the second embodiment.

DETAILED DESCRIPTION

Figure 1:
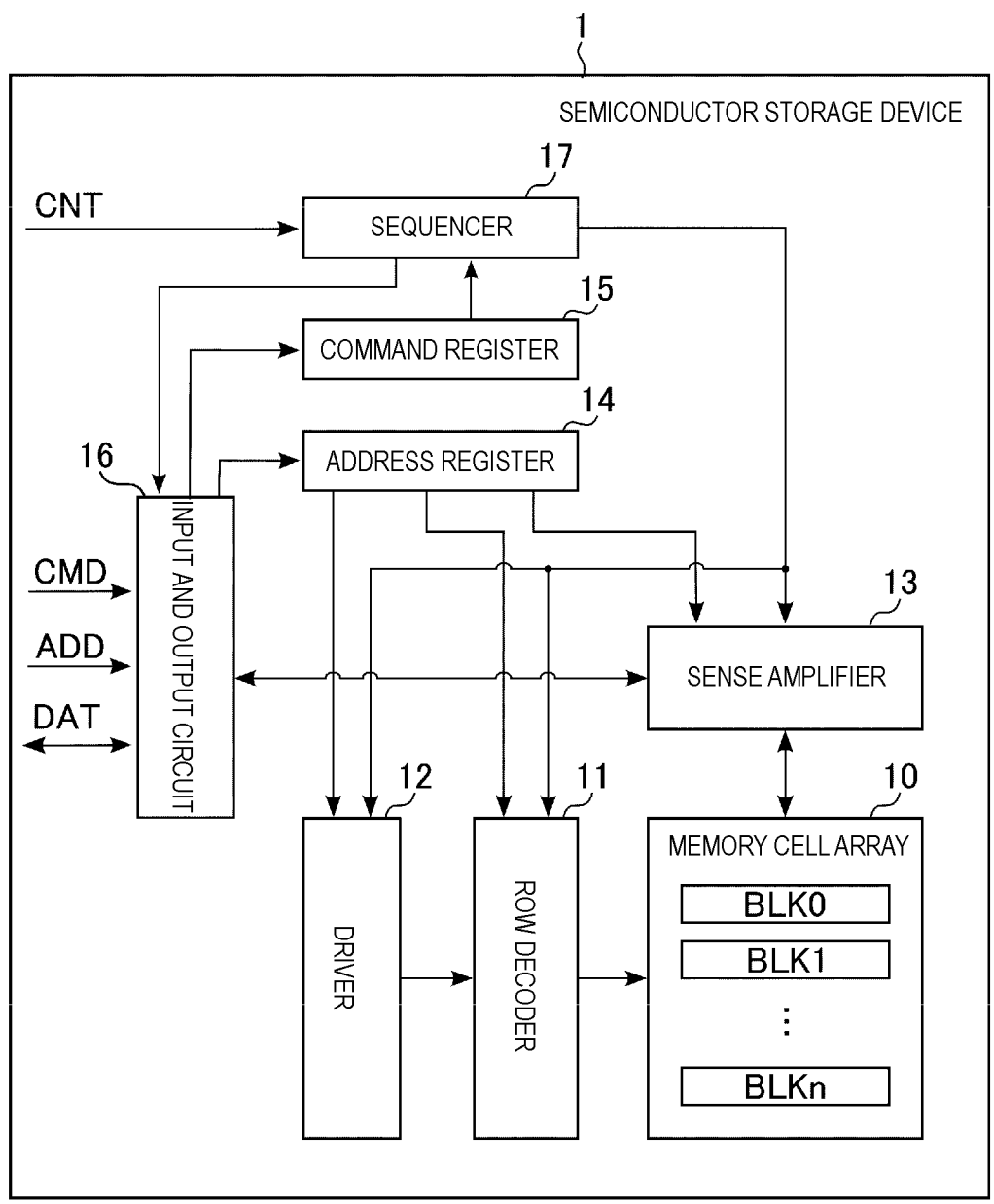
FIG. 1 is a block diagram showing a circuit configuration of a semiconductor storage device according to a first embodiment.

Embodiments provide a semiconductor storage device capable of improving operation reliability and reducing a memory cell array region.

In general, according to one embodiment, a semiconductor storage device includes a plurality of first conductive layers that are stacked in a first direction on a substrate and extend in a second direction intersecting the first direction; a plurality of second conductive layers that are stacked in the first direction on the substrate and extend in the second direction, the plurality of second conductive layers being separated from the plurality of first conductive layers in a third direction intersecting the second direction; a plurality of third conductive layers that are electrically connected to the first conductive layers and the second conductive layers and stacked in the first direction on the substrate; a first insulating layer and a second insulating layer that each extend in the first direction and the second direction and are arranged in the third direction to sandwich the first conductive layer; a third insulating layer and a fourth insulating layer that each extend in the first direction and the second direction and are arranged in the third direction to sandwich the second conductive layer; a first insulating region and a second insulating region that extend in the first direction and sandwich the plurality of third conductive layers; a plurality of first pillars that each extend in the first direction and are arranged in the second direction in the first insulating layer with a first pitch of a first distance; and a plurality of second pillars that each extend in the first direction and are arranged in the second direction in the second insulating layer with a second pitch of the first distance. Each of the plurality of second pillars is displaced from a corresponding one of the plurality of first pillars by a second distance that is shorter than a half of the first distance in the second direction.

Hereinafter, embodiments will be described with reference to the drawings. In the following description, elements having the same functions and configurations are denoted by the same reference numerals. Each of the embodiments to be described below describes a device and a method for embodying the technical idea of the present embodiment and does not specify materials, shapes, structures, arrangements or the like of the components to the following examples.

Each functional block may be achieved by either one of hardware and computer software, or a combination thereof. It is not necessary to distinguish each functional block as described in the following examples. For example, a part of functions may be implemented by other functional blocks different from functional blocks in the following examples. A functional block in the following examples may be further divided into smaller functional sub-blocks. Here, as a semiconductor storage device, a three-dimensionally stacked NAND flash memory in which memory cell transistors are stacked on a semiconductor substrate is described as an example. In the embodiments of the present disclosure, a memory cell transistor may be referred to as a memory cell.

1. First Embodiment

A semiconductor storage device according to a first embodiment will be described below.

1.1. Circuit Block Configuration of Semiconductor Storage Device

First, a circuit block configuration of the semiconductor storage device according to the first embodiment will be described. The semiconductor storage device according to the first embodiment is a NAND flash memory capable of storing data in a nonvolatile manner.

FIG. 1 is a block diagram showing a circuit configuration of the semiconductor storage device according to the first embodiment. A semiconductor storage device 1 includes a memory cell array 10, a row decoder 11, a driver 12, a sense amplifier 13, an address register 14, a command register 15, an input and output circuit 16, and a sequencer 17. For example, an external device (for example, a host device or a controller) (not shown) is connected to the semiconductor storage device 1 externally via a NAND bus.

1.1.1 Configuration of Each Block

The memory cell array 10 includes a plurality of blocks BLK0, BLK1, BLK2, ... BLKn (n is an integer of 0 or more). Each of the plurality of blocks BLK0 to BLKn includes a plurality of memory cell transistors corresponding to rows and columns. Each of the memory cell transistors can store data in a nonvolatile manner, and can electrically rewrite the data. In order to control a voltage applied to the memory cell transistors, a plurality of word lines, a plurality of bit lines and source lines are disposed in the memory cell array 10. Hereinafter, the blocks BLK0 to BLKn may be collectively referred to as blocks BLK. Details of the memory cell array 10 and the blocks BLK will be described below.

The row decoder 11 receives and decodes a row address from the address register 14. The row decoder 11 selects a certain one of the blocks BLK, and selects a word line in the selected block BLK based on the decoded row address. The row decoder 11 transfers a plurality of voltages, which are necessary for a write operation, a read operation, and an erase operation, to the memory cell array 10.

The driver 12 supplies the plurality of voltages to the selected block BLK via the row decoder 11.

When data is read, the sense amplifier 13 detects and amplifies the data read from a memory cell transistor to a bit line. When data is written, the sense amplifier 13 transfers data to be written DAT to the bit line.

The address register 14 stores, for example, an address ADD received from the external device. The address ADD includes a block address that specifies a block BLK to be operated, and a page address that specifies a word line to be operated in the specified block. The command register 15 stores a command CMD received from the external device. The command CMD includes, for example, a write command that instructs the sequencer 17 to perform the write operation, and a read command that instructs the sequencer 17 to perform the read operation.

The input and output circuit 16 is connected to the external device via a plurality of input and output lines (DQ lines). The input and output circuit 16 receives the command CMD and the address ADD from the external device. The input and output circuit 16 transmits the received command CMD to the command register 15, and transmits the received address ADD to the address register 14. The input and output circuit 16 transmits and receives data DAT to and from the external device.

The sequencer 17 receives a control signal CNT from the external device. The control signal CNT includes a chip enable signal CEn, a command latch enable signal CLE, an address latch enable signal ALE, a write enable signal WEn, and a read enable signal REn or the like. Here, "n" appended to a signal name indicates that the signal is low active.

The sequencer 17 controls an operation of the semiconductor storage device 1 based on the command CMD stored in the command register 15 and the control signal CNT. Specifically, based on the write command received from the command register 15, the sequencer 17 controls the row decoder 11, the driver 12, and the sense amplifier 13 to write data in the plurality of memory cell transistors specified by the address ADD. Based on the read command received from the command register 15, the sequencer 17 controls the row decoder 11, the driver 12, and the sense amplifier 13 to read data from the plurality of memory cell transistors specified by the address ADD.

1.1.2 Circuit Configuration of Memory Cell Array

Next, the circuit configuration of the memory cell array 10 will be described. As described above, the memory cell array includes the plurality of blocks BLK0 to BLKn. As a representative example, the circuit configuration of one block BLK is described. It should be appreciated that circuit configurations of other blocks are the same.

Figure 2:
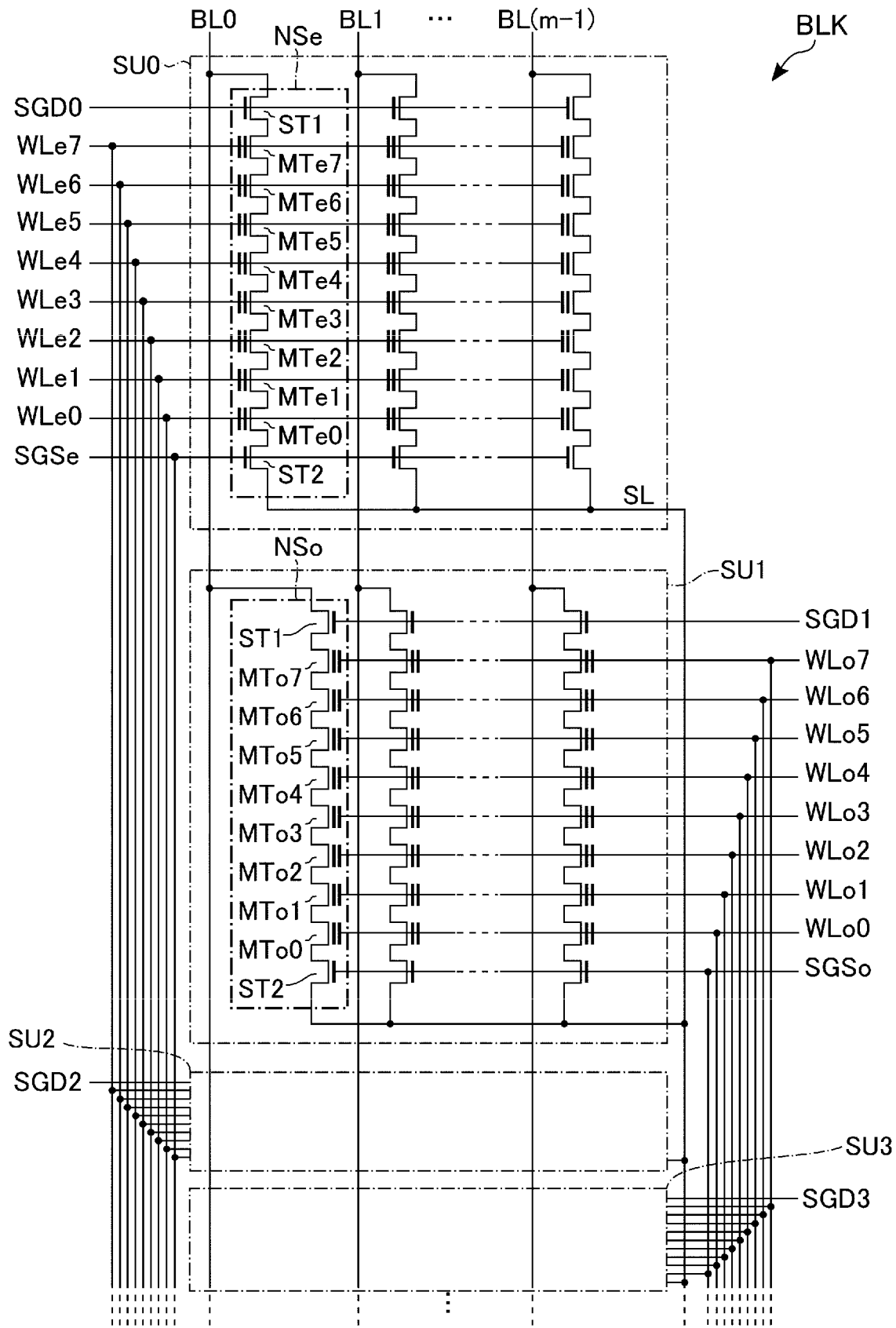
FIG. 2 is a circuit diagram of a block in a memory cell array according to the first embodiment.

FIG. 2 is a circuit diagram of one block BLK in the memory cell array 10. The block BLK includes a plurality of string units. Here, a case where the block BLK includes string units SU0, SU1, SU2, ... and SU7 will be described as an example. Each of the string units SU0 to SU7 corresponds to, for example, one page as a write unit. FIG. 2 shows the string units SU0 to SU3. The number of the string units in the block BLK may be set freely. Hereinafter, the string units SU0 to SU7 are collectively referred to as string units SU.

The string units SU0 to SU7 include even-numbered string units SU0, SU2, SU4, and SU6, and odd-numbered string units SU1, SU3, SU5, and SU7. Hereinafter, the even-numbered string units SU0, SU2, SU4, and SU6 are collectively referred to as SUe, and the odd-numbered string units SU1, SU3, SU5, and SU7 are collectively referred to as SUo.

The even-numbered string units SUe include a plurality of NAND strings NSe. The odd-numbered string units SUo include a plurality of NAND strings NSo. The NAND strings NSe and the NAND strings NSo are collectively referred to as NAND strings NS when they are referred to without distinguishing between them.

The NAND strings NS include, for example, eight memory cell transistors MT0, MT1, MT2, ... and MT7 and select transistors ST1 and ST2. Here, a case where the NAND strings NS include eight memory cell transistors is shown as an example, and the number of memory cell transistors in the NAND strings NS may be set freely.

Each of the memory cell transistors MT0 to MT7 includes a control gate and a charge storage layer, and stores data in a nonvolatile manner. The memory cell transistors MT0 to MT7 are connected in series between a source of the select transistor ST1 and a drain of the select transistor ST2. Memory cell transistors MT may be of a metal-oxide-nitride-oxide-silicon (MONOS) type using an insulating film as the charge storage layer, and may be of a floating gate (FG) type using a conductive layer as the charge storage layer. Hereinafter, the memory cell transistors MT0 to MT7 may be collectively referred to as the memory cell transistors MT.

Gates of select transistors ST1 in the string units SU0 to SU7 are respectively connected to select gate lines SGD0, SGD1, SGD2, ... and SGD7. Each of the select gate lines SGD0 to SGD7 is independently controlled by the row decoder 11.

The gate of the select transistor ST2 in each of the even-numbered string units SU0, SU2, ... and SU6 is connected to, for example, a select gate line SGSe. The gate of the select transistor ST2 in each of the odd-numbered string units SU1, SU3, ... and SU7 is connected to, for example, a select gate line SGSo. The select gate lines SGSe and SGSo, for example, may be connected as one wiring, or may be connected as separate wirings.

Control gates of the memory cell transistors MT0 to MT7 in the string units SUe in the same block BLK are respectively connected to word lines WLe0, WLe1, WLe2, ... and WLe7. On the other hand, control gates of the memory cell transistors MT0 to MT7 in the string units SUo are respectively connected to word lines WLo0, WLo1, WLo2, . . . and WLo7. Each of the word lines WLe0 to WLe7 and each of the word lines WLo0 to WLo7 are independently controlled by the row decoder 11.

The block BLK is, for example, an erase unit of data. That is, data stored in the memory cell transistors MT in the same block BLK is collectively erased. The data may be erased in unit of the string units SU, or may be erased in unit of less than the string units SU.

Drains of the select transistors ST1 of the NAND strings NS in the same column in the memory cell array 10 are respectively connected to the bit lines BL0 to BL(m−1), in which m is a natural number of 1 or more. That is, the bit lines BL0 to BL(m−1) commonly connect the NAND strings NS among the plurality of string units SU. Sources of the plurality of select transistors ST2 are connected to source lines SL.

That is, the string unit SU include the plurality of NAND strings NS connected to different bit lines BL and to the same select gate line SGD. The block BLK includes a plurality of string units SUe having the common word line WLe and a plurality of string units SUo having the common word line WLo. The memory cell array 10 includes the plurality of blocks BLK having the common bit lines BL.

In the memory cell array 10, the select gate lines SGS, the word lines WL, and the select gate lines SGD are sequentially stacked above the semiconductor substrate, thereby forming the memory cell array 10 in which the select transistors ST2, the memory cell transistors MT, and the select transistors ST1 are three-dimensionally stacked.

The memory cell array 10 may have other configurations. That is, the configuration of the memory cell array 10 is described in, for example, "THREE DIMENSIONAL STACKED NONVOLATILE SEMICONDUCTOR MEMORY" in U.S. patent application Ser. No. 12/407,403 filed on Mar. 19, 2009. In addition, the configuration is also described in "THREE DIMENSIONAL STACKED NON-VOLATILE SEMICONDUCTOR MEMORY" in U.S. patent application Ser. No. 12/406,524 filed on Mar. 18, 2009, "NON-VOLATILE SEMICONDUCTOR STORAGE DEVICE AND METHOD OF MANUFACTURING THE SAME" in U.S. patent application Ser. No. 12/679,991 filed on Mar. 25, 2010, and "SEMICONDUCTOR MEMORY AND METHOD FOR MANUFACTURING SAME" in U.S. patent application Ser. No. 12/532,030 filed on Mar. 23, 2009. The entire contents of these patent applications are incorporated herein by reference.

1.2 Layout and Structure of Semiconductor Storage Device

Next, the layout and structure of the memory cell array 10 of the semiconductor storage device according to the first embodiment will be described.

1.2.1 Layout of Memory Cell Array

Figure 3:
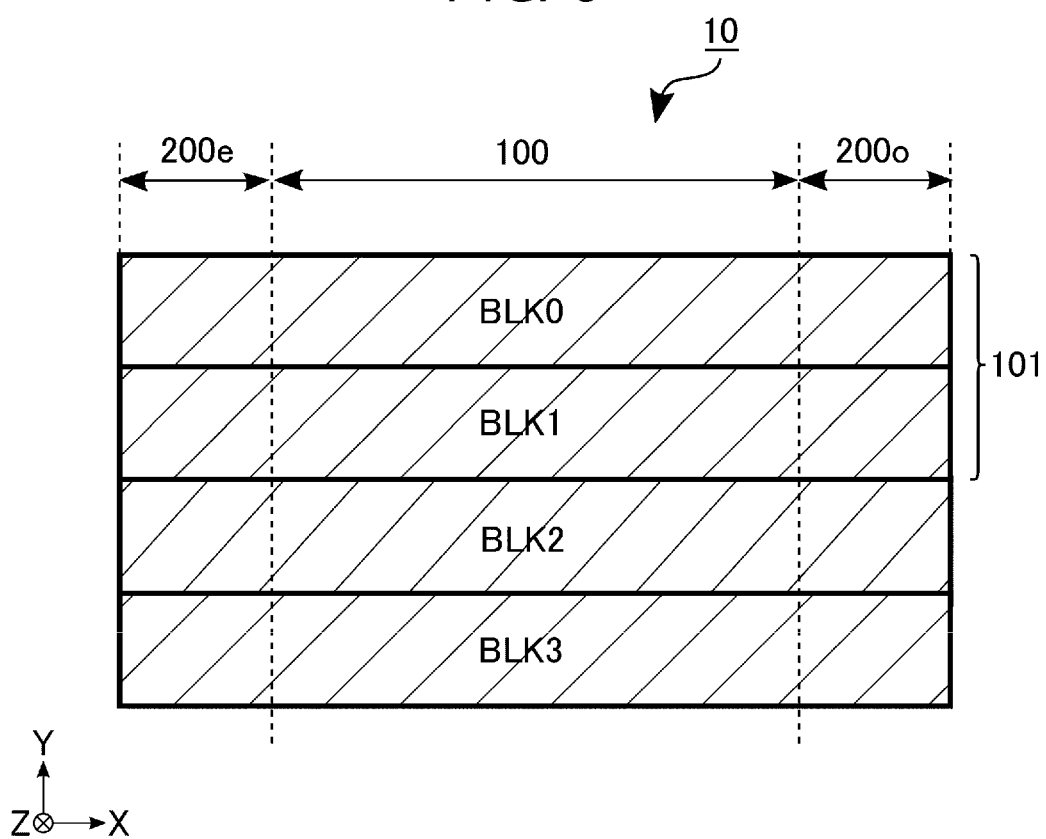
FIG. 3 is a schematic diagram of a layout in the memory cell array according to the first embodiment.

FIG. 3 is a schematic diagram of a layout of the memory cell array 10 of the semiconductor storage device. In the subsequent drawings including FIG. 3, two directions that are parallel to a semiconductor substrate surface and orthogonal to each other are respectively set as an X direction and a Y direction, and a direction orthogonal to a plane (XY plane) that includes the X direction and the Y direction is set as a Z direction (stacking direction).

The memory cell array 10 of the semiconductor storage device 1 includes a memory array region 100 and hookup regions 200e and 200o. The hookup regions 200e and 200o are disposed on both ends of the memory array region 100 in the X direction so as to sandwich the memory array region 100 in the X direction. That is, the hookup region 200e is disposed on one end of the memory array region 100 in the X direction, and the hookup region 200o is disposed on the other end of the memory array region 100 in the X direction.

The memory array region 100 includes the plurality of blocks BLK, and only the blocks BLK0 to BLK3 are shown here. The blocks BLK0 to BLK3 are arranged in order in the Y direction.

1.2.1.1 Layouts of Memory Array Region and Hookup Region

Next, a part of the memory array region 100 and the hookup regions 200e and 200o that are disposed in the semiconductor storage device 1 will be described.

Figure 4:
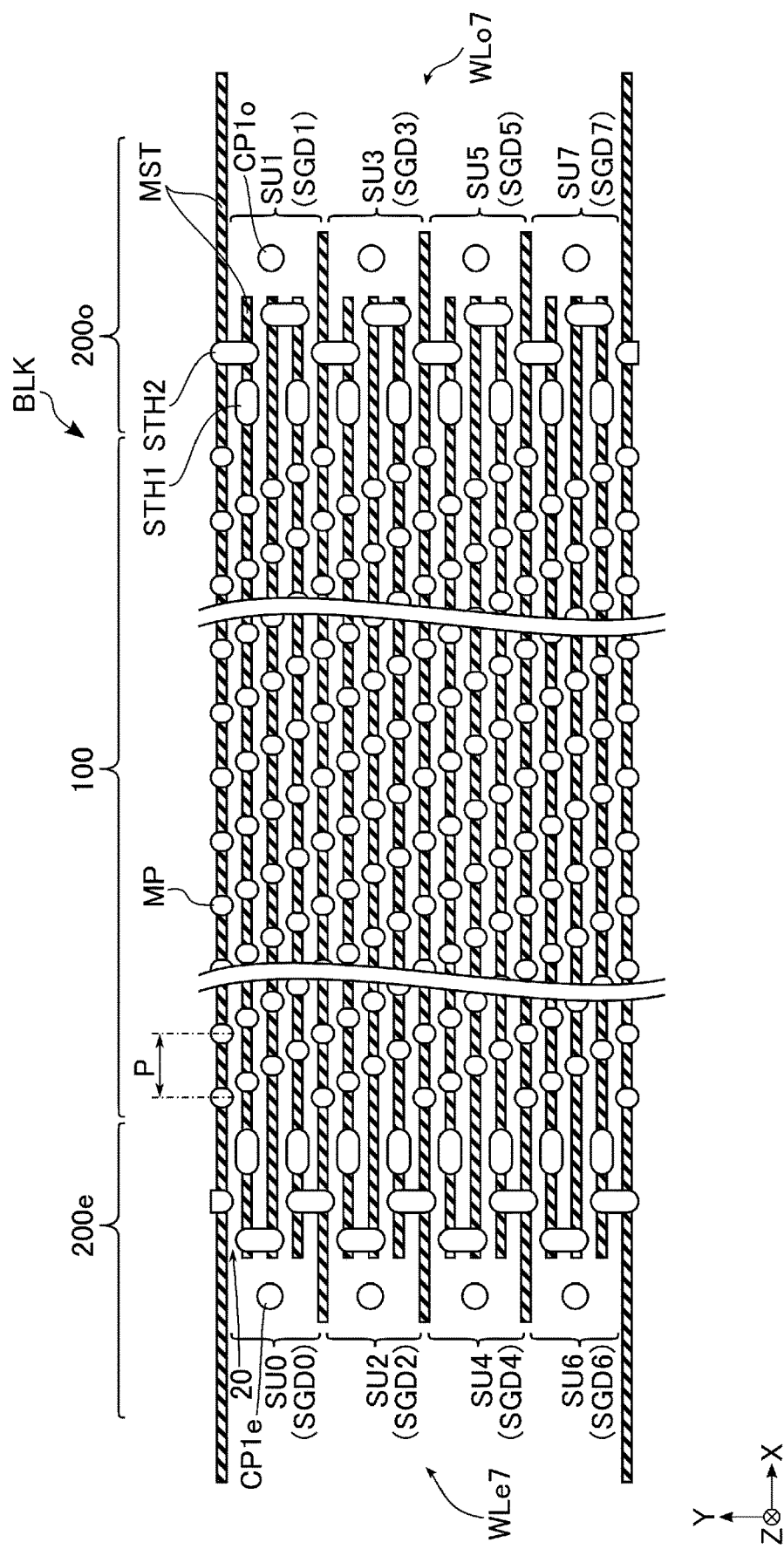
FIG. 4 is a plan view showing a part of a memory array region and a hookup region in the memory cell array according to the first embodiment.

FIG. 4 is a diagram showing an outline of the block BLK in FIG. 3, and is a plan view showing a part of the memory array region 100 and the hookup regions 200e and 200o. In FIG. 4, in order to illustrate the outline of the layout, slit regions provided in the memory array region 100 are omitted, and layouts of memory trenches MST and the select gate lines SGD (or the word lines WL) are only illustrated in a linear shape. Detailed layouts thereof will be described later with reference to FIG. 10. Further, "left" and "right" in the following description correspond to a left direction and a right direction in the drawings.

As shown in FIG. 4, the memory array region 100 is provided, and the hookup regions 200e and 200o are respectively provided on one end of the memory array region 100 and the other end of the memory array region 100. In FIG. 4, the word line WLe7 among the word lines WLe0 to WLe7, and the word line WLo7 among the word lines WLo0 to WLo7 are separately shown as an example.

As described above, the block BLK includes the string units SU0 to SU7. The select gate lines SGD0, SGD2, SGD4, and SGD6 of the string units SU0, SU2, SU4, and SU6, that is, of the string units SUe, and the word line WLe7 are drawn out in the hookup region 200e. Contact plugs CP1e separately connect the select gate lines SGD0, SGD2, SGD4, and SGD6 to an upper-layer wiring (not shown). The word line WLe7 is provided below the select gate lines SGD0, SGD2, SGD4, and SGD6.

The select gate lines SGD1, SGD3, SGD5, and SGD7 of the string units SU1, SU3, SU5, and SU7, that is, of the string units SUo, and the word line WLo7, are drawn out in the hookup region 200o. Contact plugs CP1o separately connect the select gate lines SGD1, SGD3, SGD5, and SGD7 to the upper-layer wiring (not shown). The word line WLo7 is provided below the select gate lines SGD1, SGD3, SGD5, and SGD7.

The block BLK includes a plurality of memory trenches MST, a plurality of memory pillars MP, a plurality of select gate lines SGD, and a plurality of word lines WL (not shown). The plurality of memory trenches MST are arranged at a predetermined interval in the Y direction. Each of the memory trenches MST is an insulating region, and includes, for example, a silicon oxide layer.

The plurality of memory pillars MP are arranged in the X direction in each of the memory trenches MST with an arrangement pitch of a predetermined distance P. The arrangement pitch arranged at the predetermined distance P refers to that a distance between two adjacent memory pillars MP is maintained at the predetermined distance P, and the memory pillars MP are arranged in order. Between the two memory pillars MP refer to, for example, between a center and a center, between a left end (one end) and a left end (one end), or between a right end (the other end) and a right end (the other end) of the two memory pillars MP. Details of the arrangement of the memory pillars MP will be described below.

A conductive layer 20 is provided between the adjacent memory trenches MST. The conductive layer 20 includes conductive layers 20-0 to 20-15, which will be described in further detail below. The conductive layer 20 is connected by the hookup region 200e or 200o, and corresponds to the select gate line SGD. The word lines WLe7 and WLo7 are provided below the select gate lines SGD.

The hookup regions 200e, 200o are provided with slit regions STH1 on the memory trenches MST. The slit regions STH1 are alternately arranged on the memory trenches MST arranged in the Y direction. The slit region STH1 is a region in which an insulating material is buried in a hole used in a conductive layer (word line and select gate line) replacement step to be described later. The slit region STH1 is an insulating layer, and includes, for example, a silicon oxide layer.

Slit regions STH2 are provided on the memory trenches MST and the conductive layers 20 in the hookup regions 200e and 200o. The slit regions STH2 are arranged in a staggered manner in the Y direction. The slit region STH2 is a region in which an insulating material is buried in a hole used in the conductive layer replacement step, which will be described in further detail below. The slit region STH2 is a region in which every other conductive layer 20 is insulated and separated into the select gate lines SGDe and SGDo. In the replacement step, for example, a sacrificial layer (for example, an insulating layer) that exists in a region to be the word lines WL and the select gate lines SGD is removed, and the removed region is replaced with a conductive layer. The slit region STH2 is an insulating layer, and includes, for example, a silicon oxide layer.

The hookup regions 200e and 200o are provided with contact plugs separately connected to a plurality of stacked word lines, and the contact plugs are omitted here.

1.2.1.2 Cross-Sectional Structure of Memory Cell Array

Figure 5:
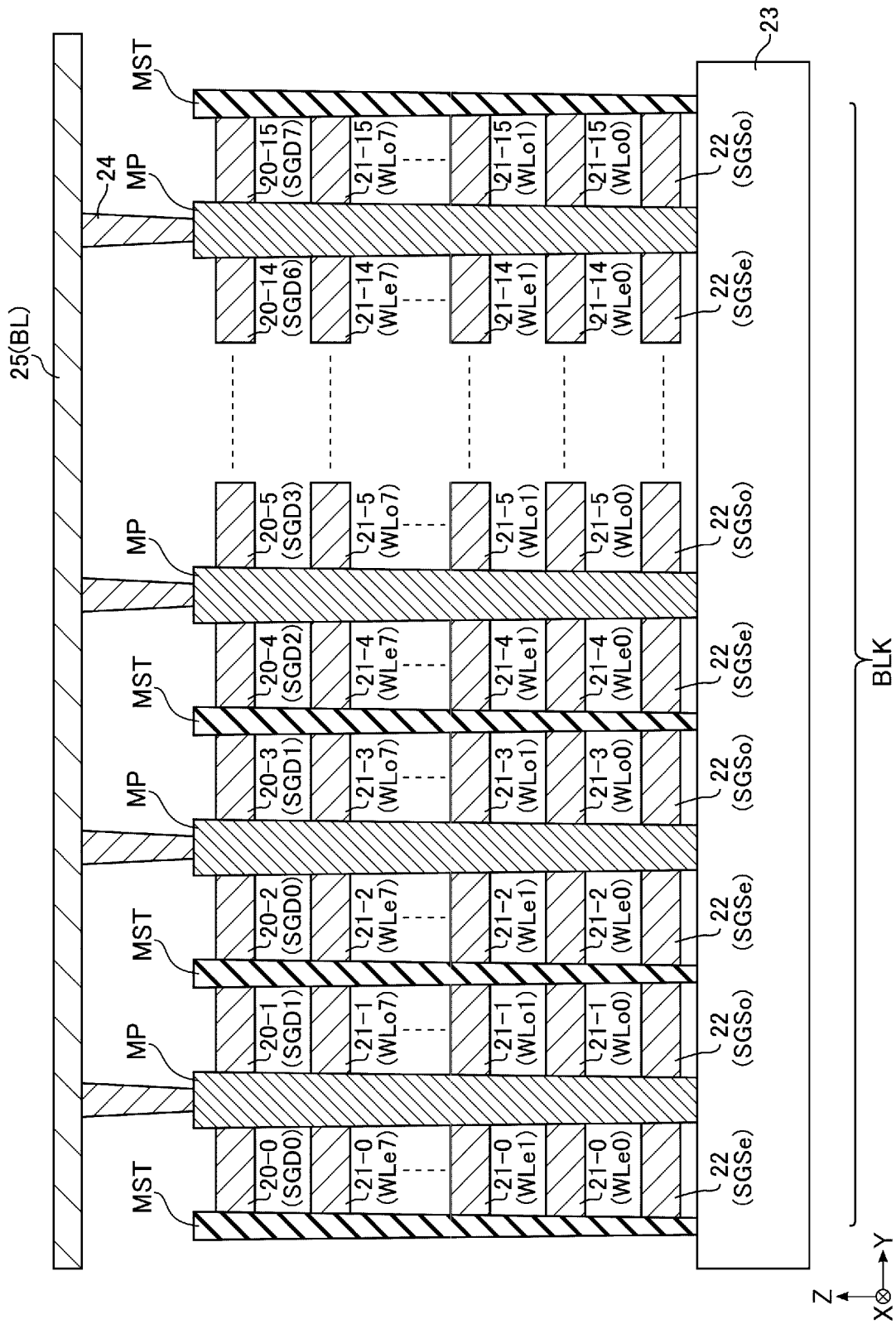
FIG. 5 is a cross-sectional view taken along a Y direction of a block in the memory cell array according to the first embodiment.

Next, the cross-sectional structure of the block BLK in the memory cell array 10 will be described. FIG. 5 is the cross-sectional view of the block BLK along the Y direction. The insulating layer between the conductive layers and the insulating layer on the conductive layer are omitted.

As shown in FIG. 5, a conductive layer 22 is provided above a semiconductor substrate (for example, a p-type well region) 23. The conductive layer 22 functions as the select gate lines SGSe and SGSo. Eight conductive layers 21 are stacked above the conductive layer 22 along the Z direction. Each of the conductive layers 21 includes conductive layers 21-0 to 21-15, and functions as the word lines WLe0 to WLe7 or WLo0 to WLo7.

The conductive layer 20 is provided above the conductive layer 21. The conductive layer 20 includes the conductive layers 20-0 to 20-15 and functions as the select gate lines SGD0 to SGD7.

The memory trenches MST and the memory pillars MP are alternately provided in the Y direction and reach the semiconductor substrate 23 from the conductive layer 20. As described above, the memory trench MST is an insulating layer. A contact plug for applying a voltage to a region provided in the semiconductor substrate 23 may be provided in the memory trench MST. For example, a contact plug that connects the source of the select transistor ST2 to the upper-layer wiring (not shown) may be provided.

The conductive layer 22 sandwiches the memory trenches MST or the memory pillars MP and functions alternately as the select gate line SGSe or SGSo. Similarly, the conductive layers 21 sandwich the memory trenches MST or the memory pillars MP, and function alternately as the word line WLe or WLo.

The memory trench MST is also provided between the adjacent blocks BLK in the Y direction. The contact plug for applying the voltage to the region provided in the semiconductor substrate 23 may be provided in the memory trench MST.

A contact plug 24 is provided on the memory pillar MP. A conductive layer 25 is provided on the contact plugs 24 along the Y direction. The conductive layer 25 functions as the bit line BL.

A cross section of the block BLK taken along the X direction will be described below.

Figure 6:
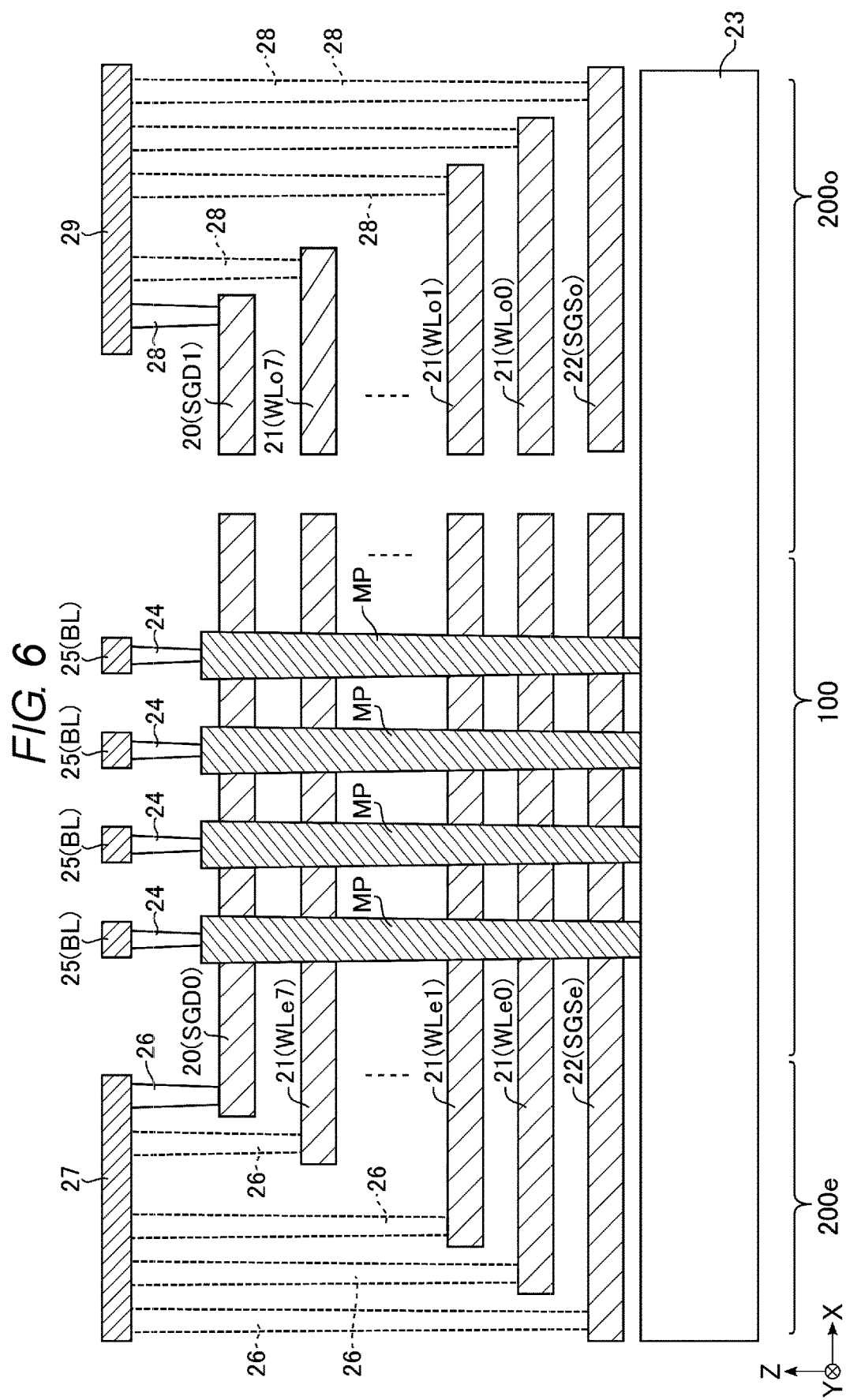
FIG. 6 is a cross-sectional view taken along an X direction of the block in the memory cell array according to the first embodiment.

FIG. 6 is a cross-sectional view of the block BLK taken along the X direction, and shows a cross-sectional structure of a region that passes through the memory pillars MP along the select gate line SGD0 in FIG. 4 as an example. The insulating layer between the conductive layers and the insulating layer on the conductive layer are omitted.

As described with reference to FIG. 5, the conductive layers 22, 21, and 20 are provided in order above the semiconductor substrate 23. The memory array region 100 is as described with reference to FIG. 4.

As shown in FIG. 6, in the hookup region 200e, the conductive layers 20 to 22 are drawn out, for example, in a stepped manner. That is, in the hookup region 200o when viewed in the XY plane, each of the conductive layers 20 to 22 has a terrace portion that does not overlap the conductive layer above. A contact plug 26 is provided on the terrace portion. Further, contact plugs 26 are connected to a conductive layer 27. The contact plugs 26 and the conductive layer 27 contain, for example, a metal such as tungsten (W).

The conductive layers 20 to 22, which function as the even-numbered select gate lines SGD0, SGD2, SGD4, and SGD6, the even-numbered word lines WLe, and the even-numbered select gate lines SGSe, are separately electrically connected to the row decoder 11 by the plurality of conductive layers 27.

On the other hand, in the hookup region 200o, the conductive layers 20 to 22 are similarly drawn out, for example, in the stepped manner. That is, in the hookup region 200o when viewed in the XY plane, each of the conductive layers 20 to 22 has a terrace portion that does not overlap the conductive layer above. A contact plug 28 is provided on the terrace portion. Further, contact plugs 28 are connected to a conductive layer 29. The contact plugs 28 and the conductive layer 29 contain, for example, a metal such as tungsten (W).

The conductive layers 20 to 22, which function as the odd-numbered select gate lines SGD1, SGD3, SGD5, and SGD7, the odd-numbered word lines WLo, and the odd-numbered select gate lines SGSo, are separately electrically connected to the row decoder 11 by the plurality of conductive layers 29.

1.2.1.3 Cross-Sectional Structure of Memory Pillar

Figure 7:
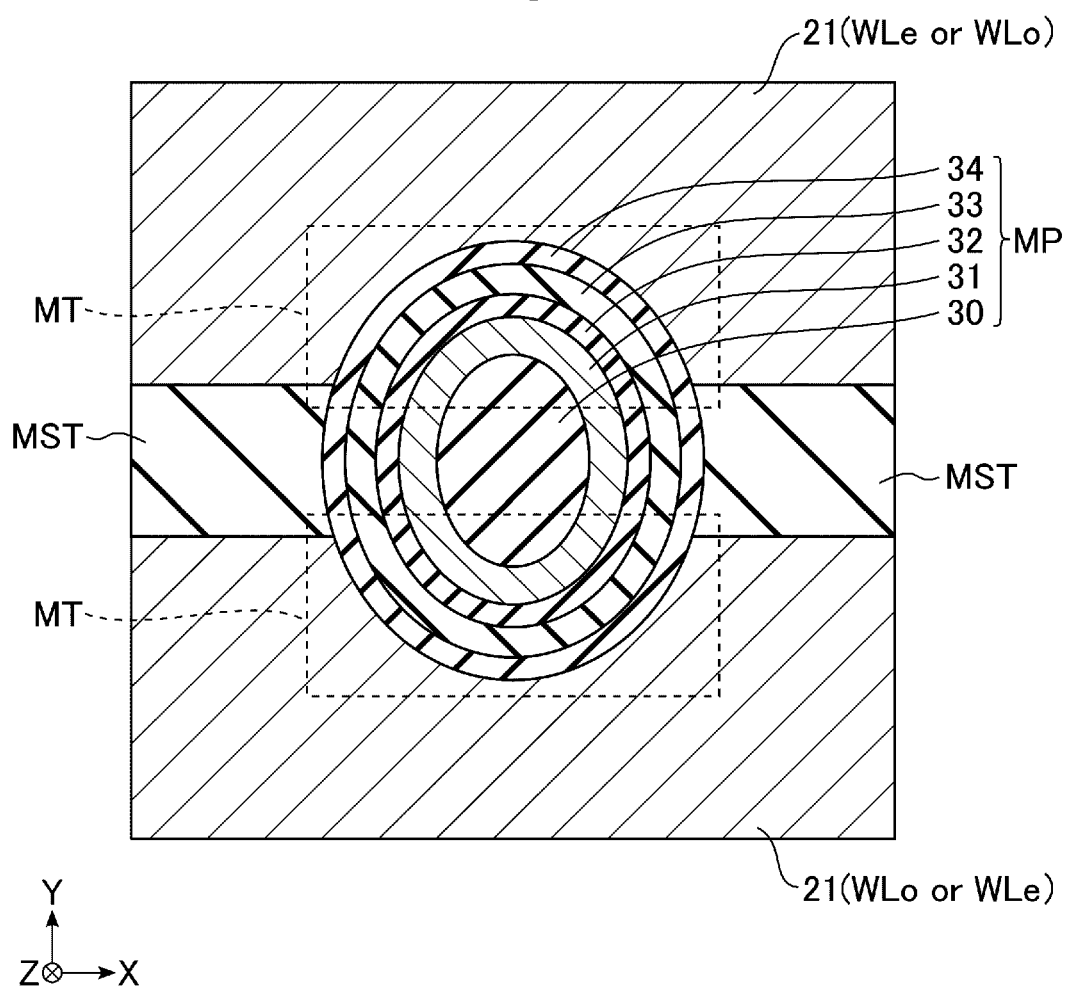
FIG. 7 is a cross-sectional view along an XY plane of a memory pillar in the block according to the first embodiment.
Figure 8:
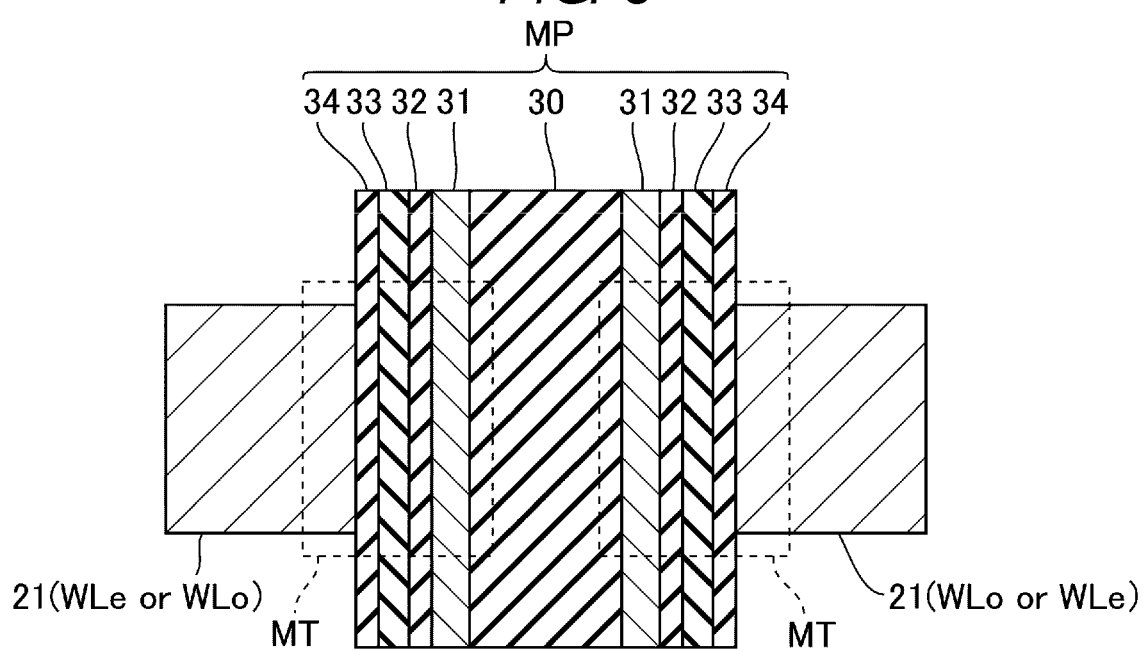
FIG. 8 is a cross-sectional view along a YZ plane of the memory pillar in the block according to the first embodiment.

Next, structures and equivalent circuits of the memory pillar MP and the memory cell transistors MT will be described. FIG. 7 is a cross-sectional view of the memory pillar MP taken along the XY plane. FIG. 8 is a cross-sectional view of the memory pillar MP taken along a YZ plane. Each of FIGS. 7 and 8 particularly shows a region in which two memory cell transistors MT are provided.

As shown in FIGS. 7 and 8, the memory pillar MP includes an insulating layer 30, a semiconductor layer 31, and insulating layers 32 to 34. The word line WLe or WLo includes the conductive layer 21.

The insulating layer 30, the semiconductor layer 31, and each of the insulating layers 32 to 34 extend in the Z direction. The insulating layer 30 is, for example, a silicon oxide layer. The semiconductor layer 31 surrounds a side surface of the insulating layer 30. The semiconductor layer 31 functions as a region in which a channel of the memory cell transistor MT is formed. The semiconductor layer 31 is, for example, a polycrystalline silicon layer.

The insulating layer 32 surrounds a side surface of the semiconductor layer 31. The insulating layer 32 functions as a gate insulating film of the memory cell transistor MT. The insulating layer 32 has, for example, a stacked structure of a silicon oxide layer and a silicon nitride layer. The insulating layer 33 surrounds a side surface of the insulating layer 32. The insulating layer 33 functions as a charge storage layer of the memory cell transistor MT. The insulating layer 33 is, for example, a silicon nitride layer. The insulating layer 34 surrounds a side surface of the insulating layer 33. The insulating layer 34 functions as a block insulating film of the memory cell transistor MT. The insulating layer 34 is, for example, a silicon oxide layer. In the memory trench MST excluding the memory pillar MP, for example, an insulating layer such as a silicon oxide layer is buried.

With the above configuration, in each of the conductive layers 21, two memory cell transistors MT are provided in one memory pillar MP in the Y direction. The select transistors ST1 and ST2 have the same configuration.

Figure 9:
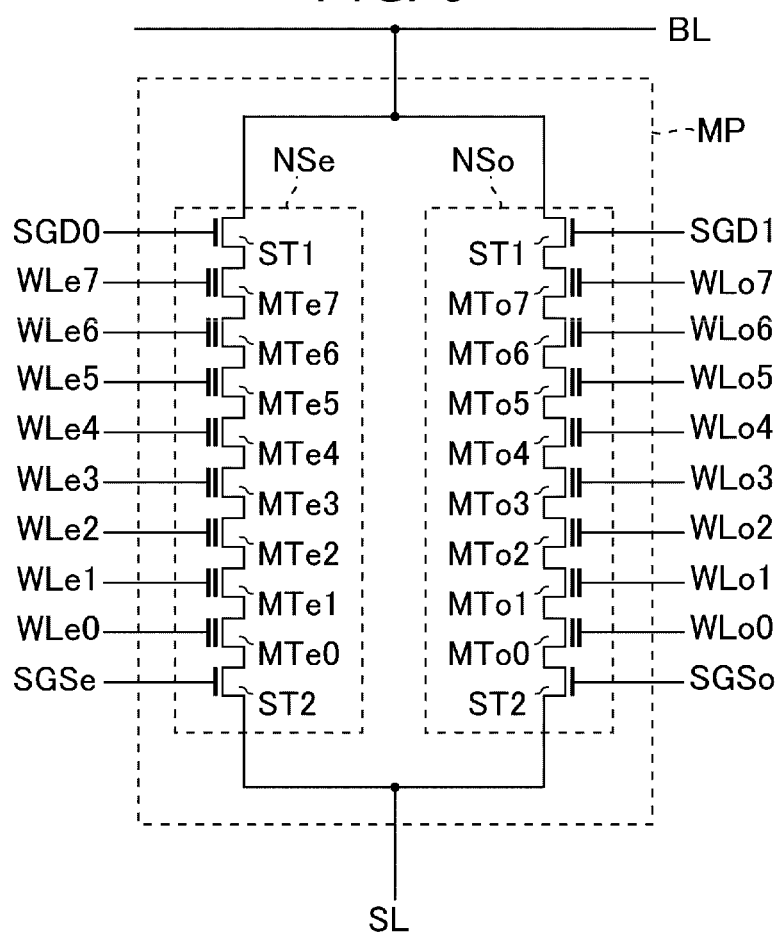
FIG. 9 is an equivalent circuit diagram of the memory pillar in the block according to the first embodiment.

The equivalent circuit of the memory pillar MP will be described below. FIG. 9 is an equivalent circuit diagram of the memory pillar MP. As shown in the drawing, two NAND strings NSe, NSo are formed in one memory pillar MP. That is, two select transistors ST1, which are provided in one memory pillar MP, are respectively connected to the different select gate lines, for example, SGD0 and SGD1. The memory cell transistors MTe0 to MTe7 and MTo0 to MTo7 are respectively connected to the different word lines WLo and WLe. The select transistors ST2 are also respectively connected to the different select gate lines SGSe and SGSo.

One end of each of the two NAND strings NSe and NSo in the memory pillar MP is connected to the same bit line BL, and the other end thereof is connected to the same source line SL. The two NAND strings NSe and NSo share a back gate (semiconductor layer 31).

1.2.1.4 Detailed Configuration of Memory Array Region

Next, the layout configuration of the memory trenches MST, the memory pillars MP, the select gate lines SGDe and SGDo, the word lines WLe and WLo, and the slit regions in the memory array region 100 according to the first embodiment will be described.

As described above, the block BLK includes the string units SU0 to SU7 that have the same layout configuration. In the memory array region 100, the select gate lines SGDe and SGDo, and the word lines WLe0, WLo0 to WLe7, and WLo7 respectively have the same layout configurations. Therefore, in the following embodiments including the present embodiment, the word lines WLe7 and WLo7 in the string unit SU0 are described as an example.

Figure 10:
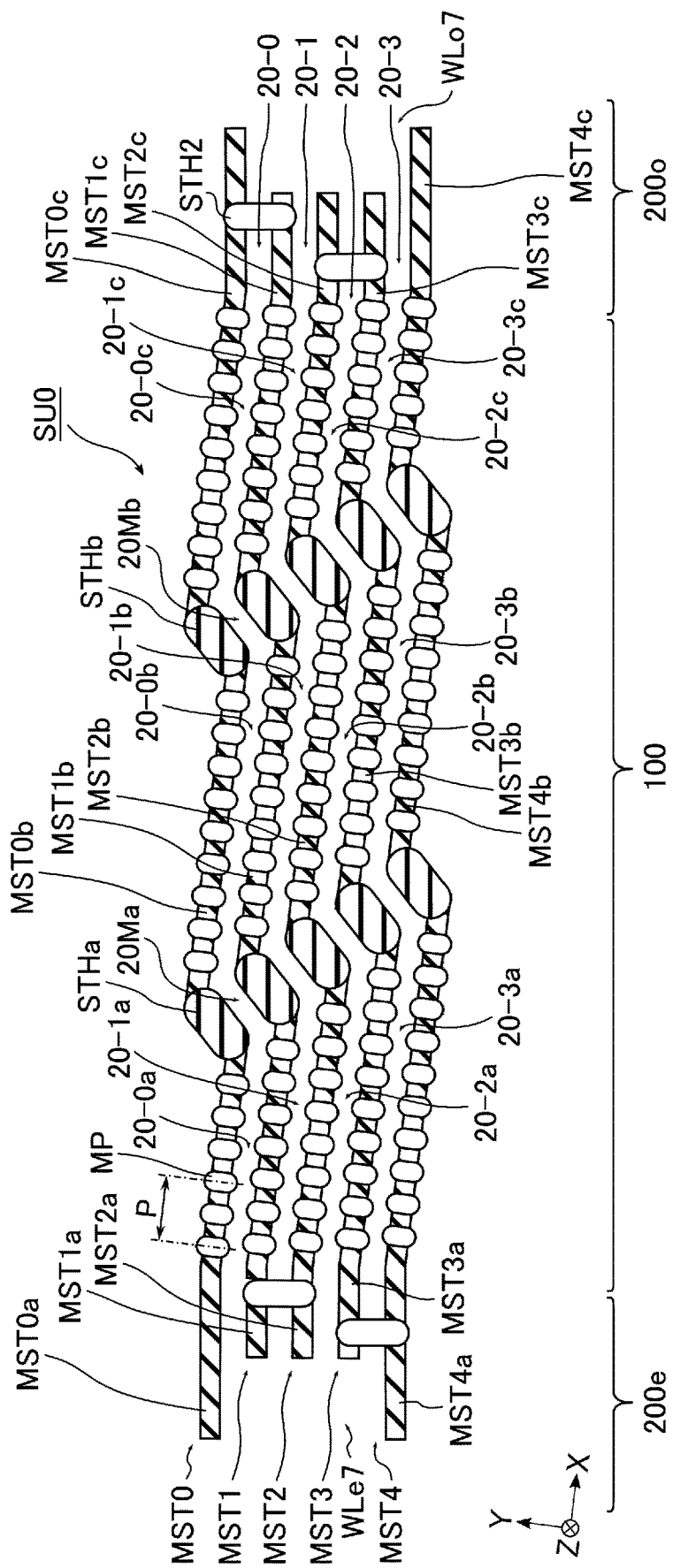
FIG. 10 is a plan layout of the memory array region in the memory cell array according to the first embodiment.

FIG. 10 is a plan layout of the memory trenches MST, the memory pillars MP, the word lines WLe7 and WLo7, and the slit regions STHa and STHb in the memory array region 100 according to the first embodiment.

As shown in FIG. 10, the conductive layers 20-0 to 20-3 that extend in the X direction are arranged along the Y direction. The conductive layers 20-0 and 20-2 are electrically connected to each other at one end in the X direction, and function as a part of the word line WLe7. The conductive layers 20-1 and 20-3 are electrically connected to each other at the other end in the X direction, and function as a part of the word line WLo7. Each of the word lines WLe7 and WLo7 is separately connected to the upper-layer wiring (not shown) via the contact plugs in the hookup regions 200e and 200o, and is further connected to the row decoder 11.

The conductive layers 20 adjacent in the Y direction are separated from each other by memory trenches MST0 to MST4. That is, the conductive layer 20-0 is disposed between the memory trenches MST0 and MST1, and is separated from other conductive layers 20 by the memory trenches MST0 and MST1. The conductive layer 20-1 is disposed between the memory trenches MST1 and MST2, and is separated from other conductive layers 20 by the memory trenches MST1 and MST2. The conductive layer 20-2 is disposed between the memory trenches MST2 and MST3, and is separated from other conductive layers 20 by the memory trenches MST2 and MST3. Further, the conductive layer 20-3 is disposed between the memory trenches MST3 and MST4, and is separated from other conductive layers 20 by the memory trenches MST3 and MST4. Hereinafter, each of the memory trenches MST0 to MST4 is referred to as a memory trench MST. The memory trench MST is, for example, a region in which an insulating material is buried from the semiconductor substrate surface to a layer where the conductive layer 20 is provided.

In the memory trench MST0, one end side (that is, left side) of the slit region STHa is set as a memory trench MST0a, a memory trench MST0b is formed between the slit regions STHa and STHb, and the other end side (that is, right side) of the slit region STHb is set as a memory trench MST0c. Similarly, in the memory trench MST1, one end side of the slit region STHa is set as a memory trench MST1a, a memory trench MST1b is formed between the slit regions STHa and STHb, and the other end side of the slit region STHb is set as a memory trench MST1c. In the memory trench MST2, one end side of the slit region STHa is set as a memory trench MST2a, a memory trench MST2b is formed between the slit regions STHa and STHb, and the other end side of the slit region STHb is set as a memory trench MST2c. In the memory trench MST3, one end side of the slit region STHa is set as a memory trench MST3a, a memory trench MST3b is formed between the slit regions STHa and STHb, and the other end side of the slit region STHb is set as a memory trench MST3c. In the memory trench MST4, one end side of the slit region STHa is set as a memory trench MST4a, a memory trench MST4b is formed between the slit regions STHa and STHb, and the other end side of the slit region STHb is set as a memory trench MST4c.

As shown in FIG. 10, the conductive layer 20-0 includes, from one end to other end of the memory array region 100, a plurality of linear conductive layers 20-0a, 20-0b, and 20-0c that are divided by the slit regions STHa and STHb, and includes conductive layers 20Ma and 20Mb that connect these linear conductive layers. Here, three conductive layers 20-0a to 20-0c are shown, and actually linear conductive layers that correspond to the number of the slit regions and conductive layers that connect these linear conductive layers are provided. Hereinafter, the slit regions STHa and STHb may be collectively referred to as slit regions STH.

The conductive layer 20-0a is a linear portion from one end of the memory array region 100 to the slit region STHa. The conductive layer 20-0b is a linear portion from the slit region STHa to the slit region STHb. The conductive layer 20-0c is a linear portion from the slit region STHb to the other end of the memory array region 100.

The conductive layers 20-0a and 20-0b are electrically connected by the conductive layer 20Ma provided between the conductive layer 20-0a and the conductive layer 20-0b. The conductive layers 20-0b and 20-0c are electrically connected by the conductive layer 20Mb provided between the conductive layer 20-0b and the conductive layer 20-0c. The integrally formed conductive layer 20-0 includes the conductive layers 20-0a, 20Ma, 20-0b, 20Mb, and 20-0c.

In other words, the conductive layer 20-0a is obliquely bent in the Y direction between slit regions STHa, and is connected to the conductive layer 20-0b via the conductive layer 20Ma. Further, the conductive layer 20-0b is obliquely bent in the Y direction between slit regions STHb and is connected to the conductive layer 20-0c via the conductive layer 20Mb.

As described above, the conductive layer 20-1 includes, from one end to the other end of the memory array region 100, a plurality of linear conductive layers 20-1a, 20-1b, and 20-1c that can be divided by the slit regions STHa and STHb, and includes the conductive layers 20Ma and 20Mb that connect these linear conductive layers. The conductive layer 20-1a is obliquely bent in the Y direction between the slit regions STHa and is connected to the conductive layer 20-1b via the conductive layer 20Ma. Further, the conductive layer 20-1b is obliquely bent in the Y direction between the slit regions STHb and is connected to the conductive layer 20-1c via the conductive layer 20Mb.

As described above, the conductive layer 20-2 also includes, from one end to the other end of the memory array region 100, a plurality of linear conductive layers 20-2a, 20-2b, and 20-2c that can be divided by the slit regions STHa and STHb, and includes the conductive layers 20Ma and 20Mb that connect these linear conductive layers. The conductive layer 20-2a is obliquely bent in the Y direction between the slit regions STHa and is connected to the conductive layer 20-2b via the conductive layer 20Ma. Further, the conductive layer 20-2b is obliquely bent in the Y direction between the slit regions STHb and is connected to the conductive layer 20-2c via the conductive layer 20Mb.

As described above, the conductive layer 20-3 also includes, from one end to the other end of the memory array region 100, a plurality of linear conductive layers 20-3a, 20-3b, and 20-3c that can be divided by the slit regions STHa and STHb, and includes the conductive layers 20Ma and 20Mb that connect these linear conductive layers. The conductive layer 20-3a is obliquely bent in the Y direction between the slit regions STHa and is connected to the conductive layer 20-3b via the conductive layer 20Ma. Further, the conductive layer 20-3b is obliquely bent in the Y direction between the slit regions STHb and is connected to the conductive layer 20-3c via the conductive layer 20Mb.

In other words, each of the conductive layers 20-0 to 20-3 extends in the X direction with a predetermined length, and is obliquely bent in the Y direction at each predetermined length.

As described above, the plurality of memory pillars MP are arranged in the X direction in each of the memory trenches MST0 to MST4 having an arrangement pitch of a predetermined distance P. Each of the memory pillars MP straddles the two conductive layers 20 that sandwich the memory trench MST. Further details of this arrangement MP will be described below.

Each of the memory pillars MP passes through the memory trench MST and the conductive layer 20, and extends in the Z direction. The memory pillar MP is a columnar body including the memory cell transistors MT and the select transistors ST1 and ST2.

The slit region STH has, for example, an oval shape (or an elliptical shape). A major axis direction (or long axis direction) of the slit region STH is oblique with respect to an extending direction (that is, the X direction) of the memory trench MST. In other words, the major axis direction of the slit region STH is in a direction that intersects the Z direction and is different from the X direction and the Y direction. An angle formed by the major axis direction of the slit region STH and the memory trench MST (for example, the memory trench MST adjacent to the conductive layer 20-0a) is greater than 90 degrees. For example, the major axis direction of the slit region STH is at a position rotated by about 135 degrees clockwise from the memory trench MST, or at a position rotated by about 45 degrees clockwise from the Y direction.

In the slit region STH, as described above, the hole used in the replacement step of the word line WL and the select gate line SGD is filled with an insulating material. In the replacement step, a sacrificial layer formed in a region in which the word line WL and the select gate line SGD are to be formed is removed, and is replaced with the conductive layer. Therefore, a minor axis width of the slit region STH is determined by a distance from the slit region STH to the word line WL and the number of stacked word lines WL. Further, between one end and the other end of the memory array region 100, slit regions STH of the number necessary for the replacement step are provided. Two slit regions STHa and STHb are shown here, and the number of the slit regions STH provided in the memory array region 100 is set to a predetermined number in design.

Figure 11:
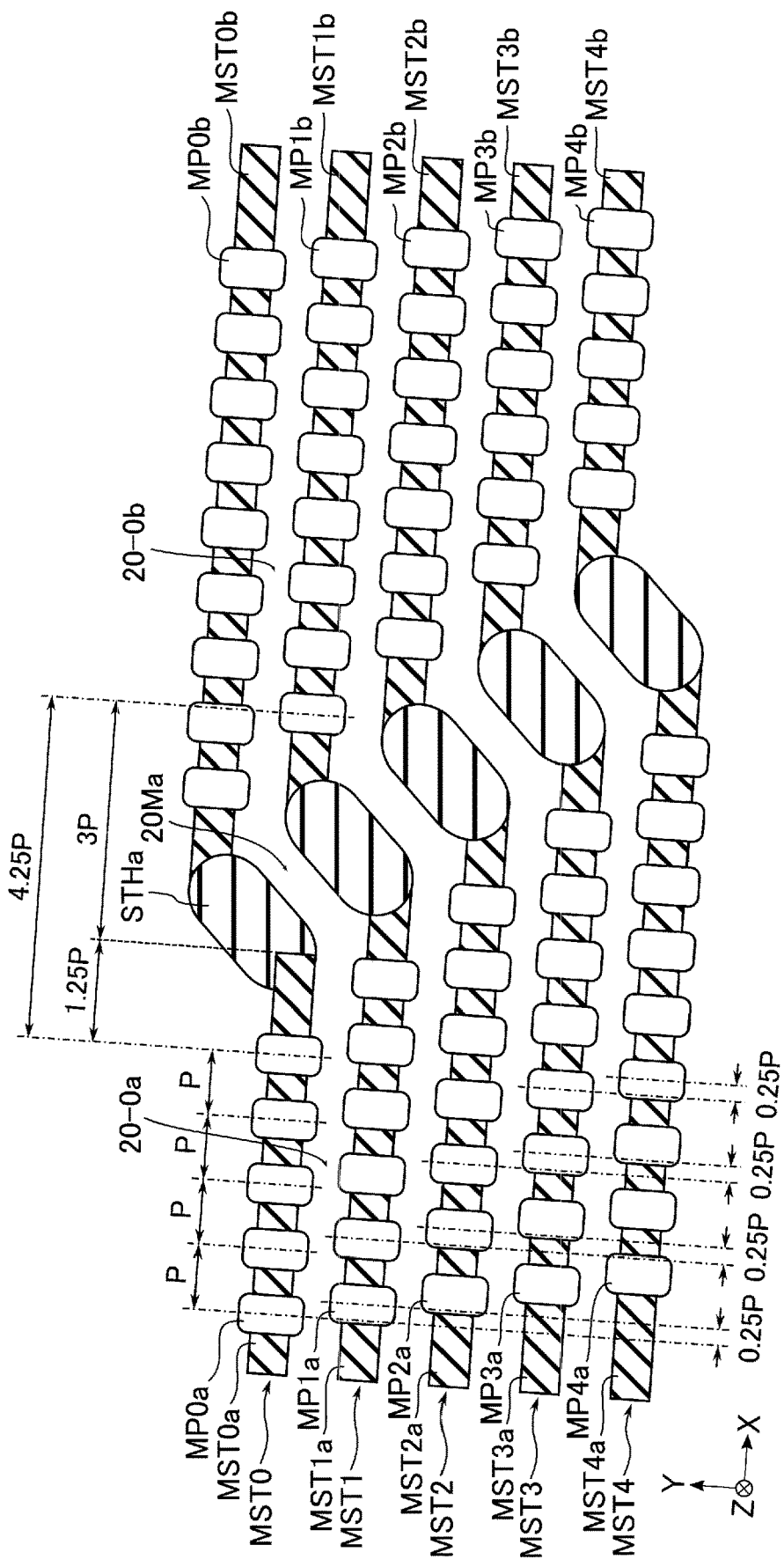
FIG. 11 is a diagram showing a memory pillar disposed in a memory trench of the memory array region according to the first embodiment.

Next, the arrangement of the memory pillars MP will be described in detail with reference to FIG. 11. FIG. 11 is a diagram showing the memory pillars MP arranged in the memory trenches MST0a to MST4a and MST0b to MST4b in FIG. 10.

In the memory trench MST0a, a plurality of memory pillars MP0a are arranged in the X direction with an arrangement pitch of the predetermined distance P. In other words, the plurality of memory pillars MP0a are arranged in the X direction such that the distance between centers of the two adjacent memory pillars MP0a is substantially equal to the predetermined distance P. In the memory trench MST0b, a plurality of memory pillars MP0b are arranged in the X direction with an arrangement pitch of the predetermined distance P. That is, the plurality of memory pillars MP0b are arranged in the X direction such that the distance between centers of two adjacent memory pillars MP0b is substantially equal to the predetermined distance P.

Similarly, in the memory trench MST1a, a plurality of memory pillars MP1a are arranged in the X direction with the arrangement pitch of the predetermined distance P, and in the memory trench MST1b, a plurality of memory pillars MP1b are arranged in the X direction with the arrangement pitch of the predetermined distance P.

In the memory trench MST2a, a plurality of memory pillars MP2a are arranged in the X direction with the arrangement pitch of the predetermined distance P, and in the memory trench MST2b, a plurality of memory pillars MP2b are arranged in the X direction with the arrangement pitch of the predetermined distance P.

In the memory trench MST3a, a plurality of memory pillars MP3a are arranged in the X direction with the arrangement pitch of the predetermined distance P, and in the memory trench MST3b, a plurality of memory pillars MP3b are arranged in the X direction with the arrangement pitch of the predetermined distance P.

In the memory trench MST4a, a plurality of memory pillars MP4a are arranged in the X direction with the arrangement pitch of the predetermined distance P, and in the memory trench MST4b, a plurality of memory pillars MP4b are arranged in the X direction with the arrangement pitch of the predetermined distance P.

The slit region STHa is disposed between the memory trench MST0a and the memory trench MST0b. Similarly, the slit region STHa is disposed between the memory trench MST1a and the memory trench MST1b, and the slit region STHa is disposed between the memory trench MST2a and the memory trench MST2b. Further, the slit region STHa is disposed between the memory trench MST3a and the memory trench MST3b, and the slit region STHa is disposed between the memory trench MST4a and the memory trench MST4b.

The plurality of memory pillars MP1a arranged in the memory trench MST1a are displaced from the plurality of memory pillars MP0a arranged in the memory trench MST0a by ¼ (0.25·P) of the predetermined distance P in the X direction. Similarly, the plurality of memory pillars MP2a are displaced from the plurality of memory pillars MP1a by ¼ (0.25·P) of the predetermined distance P in the X direction. The plurality of memory pillars MP3a are displaced from the plurality of memory pillars MP2a by ¼ (0.25·P) of the predetermined distance P in the X direction. Further, the plurality of memory pillars MP4a are displaced from the plurality of memory pillars MP3a by ¼ (0.25·P) of the predetermined distance P in the X direction.

The plurality of memory pillars MP0b to MP4b are arranged in the same manner as described above. That is, the plurality of memory pillars MP1b arranged in the memory trench MST1b are displaced from the plurality of memory pillars MP0b arranged in the memory trench MST0b by ¼ (0.25·P) of the predetermined distance Pin the X direction. The plurality of memory pillars MP2b are displaced from the plurality of memory pillars MP1b by ¼ (0.25·P) of the predetermined distance P in the X direction. The plurality of memory pillars MP3b are displaced from the plurality of memory pillars MP2b by ¼ (0.25·P) of the predetermined distance P in the X direction. Further, the plurality of memory pillars MP4b are displaced from the plurality of memory pillars MP3b by ¼ (0.25·P) of the predetermined distance P in the X direction. The plurality of memory pillars arranged in the memory trenches MST0c to MST4c (not shown in FIG. 11) are arranged in the same manner as described above.

A distance between a center of the memory pillar MP0a disposed on a rightmost side (that is, the other end side) of the memory trench MST0a and a center of the memory pillar MP1b disposed on a leftmost side (that is, one end side) of the memory trench MST1b is substantially 4.25 times the predetermined distance P. A distance between the center of the rightmost memory pillar MP0a of the memory trench MST0a and a right end (that is, the other end) of the memory trench MST0a is substantially 1.25 times the predetermined distance P. Further, a distance between the right end of the memory trench MST0a and the center of the leftmost memory pillar MP1b of the memory trench MST1b is substantially three times the predetermined distance P.

The same applies to the memory pillar MP1a and the memory pillar MP2b, the memory pillar MP2a and the memory pillar MP3b, and the memory pillar MP3a and the memory pillar MP4b.

That is, a distance between a center of the memory pillar MP1a disposed on a rightmost side of the memory trench MST1a and a center of the memory pillar MP2b disposed on a leftmost side of the memory trench MST2b is substantially 4.25 times the predetermined distance P. A distance between a center of the rightmost memory pillar MP1a of the memory trench MST1a and a right end (that is, the other end) of the memory trench MST1a is substantially 1.25 times the predetermined distance P. Further, a distance between the right end of the memory trench MST1a and the center of the leftmost memory pillar MP2b of the memory trench MST2b is substantially three times the predetermined distance P.

A distance between a center of the memory pillar MP2a disposed on a rightmost side of the memory trench MST2a and a center of the memory pillar MP3b disposed on a leftmost side of the memory trench MST3b is substantially 4.25 times the predetermined distance P. A distance between a center of the rightmost memory pillar MP2a of the memory trench MST2a and a right end of the memory trench MST2a is substantially 1.25 times the predetermined distance P. Further, a distance between the right end of the memory trench MST2a and the center of the leftmost memory pillar MP3b of the memory trench MST3b is substantially three times the predetermined distance P.

A distance between a center of the memory pillar MP3a disposed on a rightmost side of the memory trench MST3a and a center of the memory pillar MP4b disposed on a leftmost side of the memory trench MST4b is substantially 4.25 times the predetermined distance P. A distance between a center of the rightmost memory pillar MP3a of the memory trench MST3a and a right end of the memory trench MST3a is substantially 1.25 times the predetermined distance P. Further, a distance between the right end of the memory trench MST3a and the center of the leftmost memory pillar MP4b of the memory trench MST4b is substantially three times the predetermined distance P.

In other words, the configuration described above is as follows.

Five memory trenches MST adjacent to each other in the Y direction are first, second, third, fourth, and fifth memory trenches. The memory pillar MP arranged in the first memory trench is a first memory pillar MP, the memory pillar MP arranged in the second memory trench is a second memory pillar MP, the memory pillar MP arranged in the third memory trench is a third memory pillar MP, the memory pillar MP arranged in the fourth memory trench is a fourth memory pillar MP, and the memory pillars MP arranged in the fifth memory trench is a fifth memory pillar MP. The X direction and the Y direction are regarded as the X axis and the Y axis.

As described above, the first memory pillar MP and the fifth memory pillar are provided at the same position on the X axis. The second memory pillar MP is disposed on the X axis so as to be displaced from the first memory pillar MP by ¼ (0.25·P) of the predetermined distance P. The third memory pillar MP is disposed on the X axis so as to be displaced from the second memory pillar MP by ¼ (0.25·P) of the predetermined distance P. Further, the fourth memory pillar MP is disposed on the X axis so as to be displaced from the third memory pillar MP by ¼ (0.25·P) of the predetermined distance P.

The arrangement of the memory pillars MP0b to MP4b of the memory trenches MST0b to MST4b and the arrangement of the memory pillars arranged in the memory trenches MST0c to MST4c on the right side (that is, the other end side) of the slit region STHb are the same as described above, and description thereof is omitted.

Figure 12:
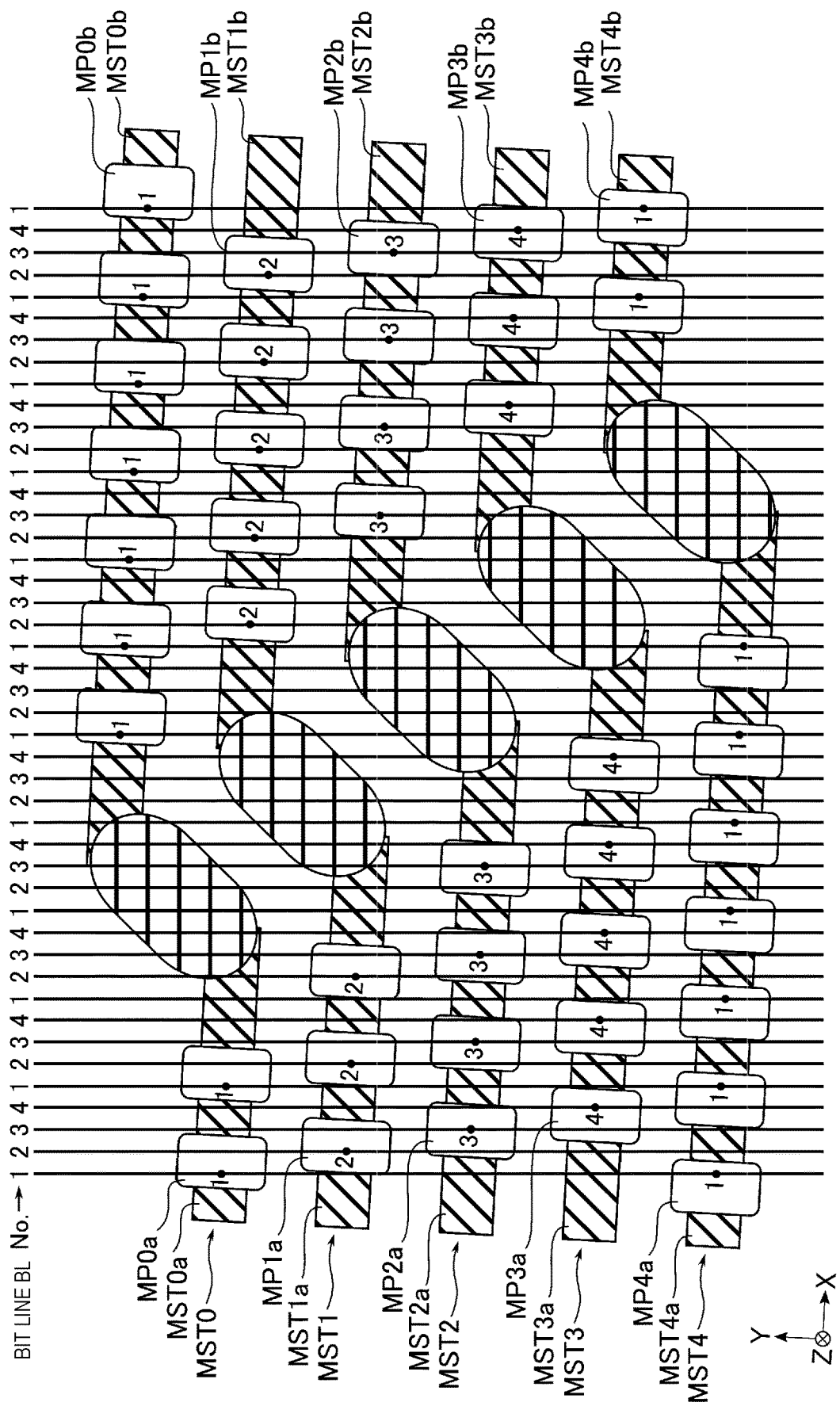
FIG. 12 is a diagram showing a bit line connected to the memory pillar of the memory array region according to the first embodiment.

Next, the bit lines BL connected to the memory pillars MP according to the first embodiment will be described with reference to FIG. 12. FIG. 12 is a diagram showing the bit lines BL connected to the memory pillars MP in FIG. 11.

The bit lines BL are provided above the memory pillars MP0a to MP4a and MP0b to MP4b, and the bit lines BL are electrically connected to the memory pillars MP0a to MP4a and MP0b to MP4b.

As shown in FIG. 12, the plurality of bit lines BL extend, for example, in the Y direction. The bit lines BL are arranged in the X direction with an arrangement pitch of a certain distance (for example, ¼ of the predetermined distance P). Here, for example, the bit lines BL1 to BL4 having attributes of numbers 1 to 4 are arranged in the X direction with an arrangement pitch of ¼ (0.25·P) of the predetermined distance P. Further, a set of bit lines BL1 to BL4 is set as one set, and the set is arranged in a repeated manner.

The plurality of memory pillars MP0a arranged in the memory trench MST0a are respectively connected to the bit line BL1 repeatedly appearing among the bit lines BL1 to BL4. Further, the plurality of memory pillars MP0b arranged in the memory trench MST0b are respectively connected to the repeatedly appearing bit line BL1 among the bit lines BL1 to BL4, which is similar to the memory pillar MP0a. Accordingly, the memory pillars MP0a and MP0b connected to a word line WLe7 (or the select gate line SGD) are connected to the bit line BL1.

The plurality of memory pillars MP1a arranged in the memory trench MST1a are respectively connected to the bit line BL2 repeatedly appearing among the bit lines BL1 to BL4. Further, the plurality of memory pillars MP1b arranged in the memory trench MST1b are respectively connected to the repeatedly appearing bit line BL2 among the bit lines BL1 to BL4, which is similar to the memory pillar MP1a. Accordingly, the memory pillars MP1a and MP1b connected to the word lines WLe7 and WLo7 (or the select gate line SGD) are connected to the bit line BL2.

The plurality of memory pillars MP2a arranged in the memory trench MST2a are respectively connected to the bit line BL3 repeatedly appearing among the bit lines BL1 to BL4. Further, similar to the memory pillar MP2a, the plurality of memory pillars MP2b arranged in the memory trench MST2b are connected to the bit line BL3 that repeatedly appears among the bit lines BL1 to BL4. Accordingly, the memory pillars MP2a and MP2b connected to the word lines WLe7 and WLo7 (or the select gate line SGD) are connected to the bit line BL3.

The plurality of memory pillars MP3a arranged in the memory trench MST3a are respectively connected to the bit line BL4 repeatedly appearing among the bit lines BL1 to BL4. Further, similar to the memory pillar MP3a, the plurality of memory pillars MP3b arranged in the memory trench MST3b are connected to the bit line BL4 that repeatedly appears among the bit lines BL1 to BL4. Accordingly, the memory pillars MP3a and MP3b connected to the word lines WLe7 and WLo7 (or the select gate line SGD) are connected to the bit line BL4.

The plurality of memory pillars MP4a arranged in the memory trench MST4a are respectively connected to the bit line BL1 repeatedly appearing among the bit lines BL1 to BL4. Further, similar to the memory pillar MP4a, the plurality of memory pillars MP4b arranged in the memory trench MST4b are connected to the bit line BL1 that repeatedly appears among the bit lines BL1 to BL4. Accordingly, the memory pillars MP4a and MP4b connected to the word line WLo7 (or the select gate line SGD) are connected to the bit line BL1.

As described above, in the configuration in the first embodiment, the memory pillars MP (or memory cell transistors MT, select transistors ST1 and ST2) connected to the same word line WL (or the same select gate line SGD) are connected to the bit line BL having the same attribute.

1.3 Effects of Embodiments

According to the first embodiment, a semiconductor storage device capable of improving operation reliability and reducing a memory cell array region can be provided. In detail, it is possible to prevent calculation of the bit line control for selecting the bit line BL from becoming complicated during the write and read operations. Further, an increase in a dummy region in which the slit region STH used in the replacement step such as the word line WL is provided can be prevented, and the memory cell array region can be reduced.

Effects of the first embodiment described above will be described below.

In the semiconductor storage device according to the present embodiment, the memory trench MST for dividing the memory cell transistor MT is provided. Due to the memory trench MST, there are various restrictions on the layout within the memory cell array region. For example, when the replacement step is performed using a line-shaped slit region, the memory trench MST becomes a wall, and the word line WL or the like cannot be replaced. For this reason, the replacement step is performed from the hole-shaped slit region STH. In order to perform the replacement step from the slit region STH, it is necessary to ensure a minor axis width of the slit region STH corresponding to the number of stacked word lines or the distance from the slit region STH to the word line formation region. However, when the minor axis width direction is disposed in the direction orthogonal to the extending direction of the memory trench MST, the size of the memory cell array region is limited to the minor axis width of the slit region STH, and the memory cell array region cannot be reduced.

Therefore, a layout may be used in which the major axis direction or the minor axis direction of the slit region STH is disposed obliquely relative to the extending direction of the memory trench MST. When the slit region STH is disposed obliquely, the size of the memory cell array region is not limited to the minor axis width, and the minor axis width can be increased. However, since the dummy region (including the slit region STH) where the memory pillar MP cannot be disposed is shifted, the bit lines BL having different attributes may be connected to the memory pillars MP connected to the same select gate line SGD (or word line WL).

In order to select a memory cell in the write and read operations, the select gate line SGD, the word lines WL, and the bit lines BL are used. When using a layout in which the major axis direction (or the minor axis direction) of the slit region STH is diagonally disposed, since the dummy region including the slit region STH is shifted, the arrangement of the memory pillars MP, the arrangement of the slit regions STH, and a selection method of the select gate line SGD are not periodic, and the calculation of bit line control for selecting the bit lines becomes complicated. For example, there is a problem that the calculation of write inhibit processing of the bit lines BL in the write operation becomes complicated.

The present embodiment includes the plurality of first memory pillars MP0a arranged in the X direction in the memory trench MST0a with an arrangement pitch of the first distance (predetermined distance P), and the plurality of second memory pillars MP1a arranged in the X direction in the memory trench MST1a with the arrangement pitch of the first distance (predetermined distance P). The arrangement of the second memory pillars MP1a is displaced from the arrangement of the first memory pillars MP0a by a second distance shorter than half the first distance in the X direction. For example, the arrangement of the second memory pillars MP1a is displaced from the arrangement of the first memory pillars MP0a by ¼ of the predetermined distance P in the X direction. Accordingly, the memory pillars MP selected by the same select gate line SGD can be connected to the bit lines BL having the same attribute. In other words, the bit line BL No.s connected to the memory pillars MP selected by the same select gate line SGD can be aligned. As a result, it is possible to prevent the calculation of the bit line control from becoming complicated and to simplify the calculation. Further, an increase in the dummy region including the slit region STH can be prevented, and the memory cell array region can be reduced.

Further, by obliquely disposing the major axis direction (or minor axis direction) of the slit region STH in the X direction or the Y direction, it is possible to shorten the distance between the plurality of memory pillars MP adjacent in the Y direction. Accordingly, the memory cell array region can be further reduced.

2. Second Embodiment

Next, a semiconductor storage device according to a second embodiment will be described. The second embodiment is an example in which, in the plurality of memory trenches MST arranged in the Y direction, the slit region STH is disposed in every other one of the memory trenches MST and the memory trench MST between the slit regions STH is obliquely disposed. In the second embodiment, differences from the first embodiment will be mainly described. Other configurations not described are the same as those of the first embodiment.

2.1 Detailed Configuration of Memory Array Region

Figure 13:
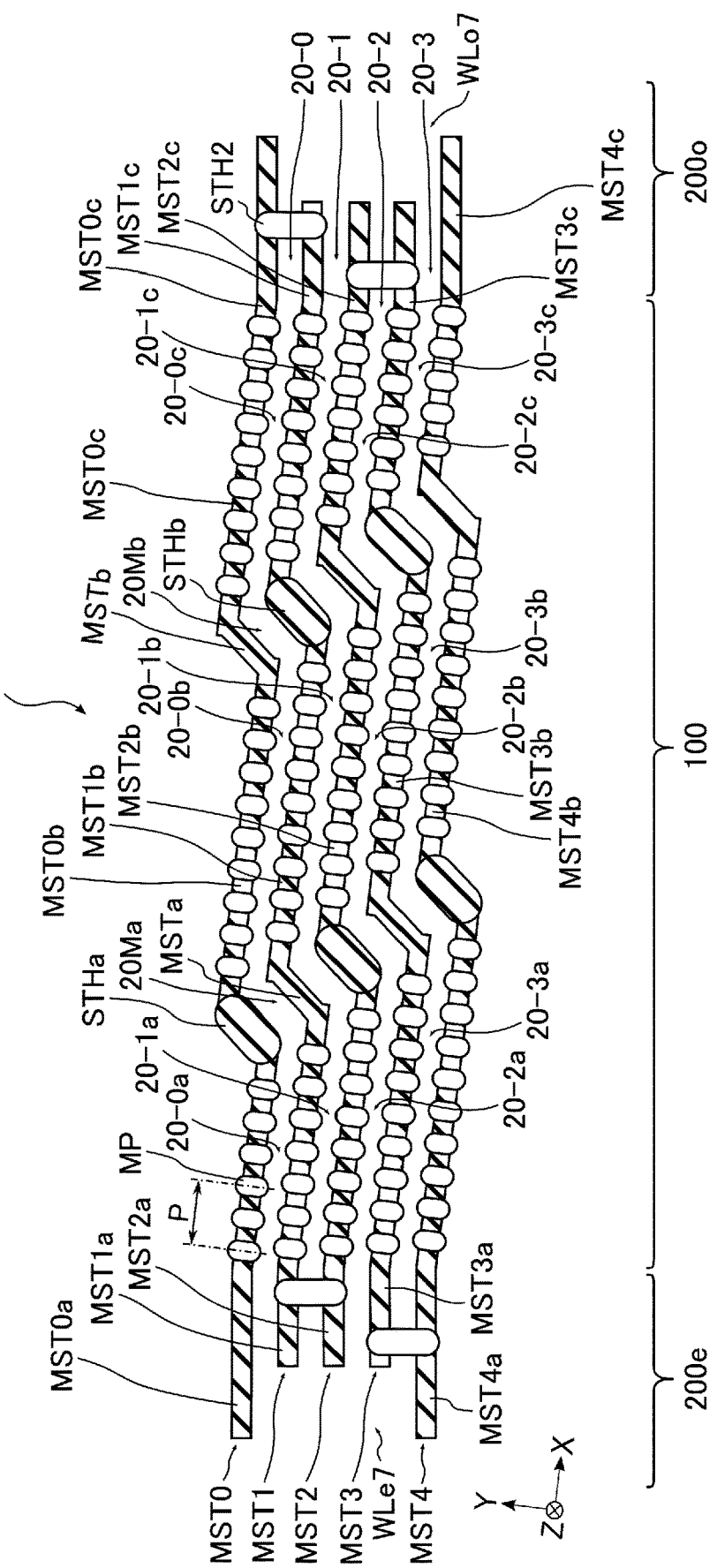
FIG. 13 is a plan layout of a memory array region in a memory cell array according to a second embodiment.

FIG. 13 is a plan layout of the memory trenches MST, the memory pillars MP, the word lines WLe7 and WLo7, and the slit regions STHa and STHb in the memory array region 100 according to the second embodiment.

In the second embodiment, as in the first embodiment, extending directions of the plurality of memory trenches MST0 to MST4 are parallel to the X direction, and the plurality of memory trenches MST0 to MST4 are arranged in the Y direction.

The slit regions STHa and STHb are provided on every other one of the memory trenches MST0 to MST4 arranged in the Y direction, and the slit regions STHa and STHb are disposed such that a major axis direction thereof faces the Y direction.

The slit region STHa is provided between an end of the memory trench MST0a and an end of the MST0b, between an end of the memory trench MST2a and an end of the MST2b, and between an end of the memory trench MST4a and an end of the MST4b.

The slit region STHb is provided between an end of the memory trench MST1b and an end of the MST1c and between an end of the memory trench MST3b and an end of the MST3c.

A memory trench MSTa is provided between an end of the memory trench MST1a and an end of the MST1b and between an end of the memory trench MST3a and an end of the MST3b. The memory trench MSTa is disposed obliquely relative to the X direction or the Y direction. For example, an angle between the X direction and the memory trench MSTa is 45 degrees or 135 degrees, and an angle between the Y direction and the memory trench MSTa is 45 degrees.

A memory trench MSTb is provided between an end of the memory trench MST0b and an end of the MST0c, between an end of the memory trench MST2b and an end of the MST2c, and between an end of the memory trench MST4b and an end of the MST4c. The memory trench MSTb is disposed obliquely with respect to the X direction or the Y direction. For example, an angle between the X direction and the memory trench MSTb is 45 degrees or 135 degrees, and an angle between the Y direction and the memory trench MSTb is 45 degrees.

Next, the arrangement of the memory pillars MP will be described in detail with reference to FIG. 14. FIG. 14 is a diagram showing the memory pillars MP arranged in the memory trenches MST0a to MST4a and MST0b to MST4b in FIG. 13.

Details of the arrangement of the memory pillars MP in the second embodiment shown in FIG. 14 are the same as the arrangement of the memory pillars MP in the first embodiment shown in FIG. 11. That is, in each of the memory trenches MST0 to MST4, a plurality of memory pillars MP are arranged in the X direction with an arrangement pitch of the predetermined distance P. In other words, the plurality of memory pillars MP are arranged in the X direction such that the distance between centers of two adjacent memory pillars MP is substantially equal to the predetermined distance P.

The plurality of memory pillars MP1a arranged in the memory trench MST1a are displaced from the plurality of memory pillars MP0a arranged in the memory trench MST0a by ¼ (0.25·P) of the predetermined distance P in the X direction. Similarly, the plurality of memory pillars MP2a are displaced from the plurality of memory pillars MP1a by ¼ (0.25·P) of the predetermined distance P in the X direction. The plurality of memory pillars MP3a are displaced from the plurality of memory pillars MP2a by ¼ (0.25·P) of the predetermined distance P in the X direction. Further, the plurality of memory pillars MP4a are displaced from the plurality of memory pillars MP3a by ¼ (0.25·P) of the predetermined distance P in the X direction.

The arrangement of the memory pillars arranged in the plurality of memory pillars MP0b to MP4b and the memory trenches MST0c to MST4c is the same as described above.

A distance between a center of the memory pillar MP0a disposed on a rightmost side (that is, the other end side) of the memory trench MST0a and a center of the memory pillar MP1b disposed on a leftmost side (that is, one end side) of the memory trench MST1b is substantially 4.25 times the predetermined distance P. A distance between the center of the rightmost memory pillar MP0a of the memory trench MST0a and a right end (that is, the other end) of the memory trench MST0a is substantially 1.25 times the predetermined distance P. Further, a distance between the right end of the memory trench MST0a and the center of the leftmost memory pillar MP1b of the memory trench MST1b is substantially three times the predetermined distance P.

The memory pillar MP1a and the memory trench MST1a and the memory pillar MP2b, the memory pillar MP2a and the memory trench MST2a and the memory pillar MP3b, and the memory pillar MP3a and the memory trench MST3a and the memory pillar MP4b have the same relationship as described above.

Next, the bit lines BL connected to the memory pillars MP according to the second embodiment will be described with reference to FIG. 15. FIG. 15 is a diagram showing the bit lines BL connected to the memory pillars MP in FIG. 14.

Details of the bit lines BL connected to the memory pillars MP0a to MP4a and MP0b to MP4b shown in FIG. 15 are the same as the details of the bit lines BL connected to the memory pillars MP0*a* to MP4*a* and MP0*b* to MP4*b* according to the first embodiment shown in FIG. 11.

That is, the plurality of memory pillars MP0*a* arranged in the memory trench MST0*a* are respectively connected to the bit line BL1 repeatedly appearing among the bit lines BL1 to BL4. Further, the plurality of memory pillars MP0*b* arranged in the memory trench MST0*b* are respectively connected to the bit line BL1 repeatedly appearing among the bit lines BL1 to BL4. Accordingly, the memory pillars MP0*a* and MP0*b* connected to the word line WLe7 (or the select gate line SGD) are connected to the bit line BL1.

The plurality of memory pillars MP1*a* arranged in the memory trench MST1*a* are respectively connected to the bit line BL2 repeatedly appearing among the bit lines BL1 to BL4. Further, the plurality of memory pillars MP1*b* arranged in the memory trench MST1*b* are respectively connected to the bit line BL2 repeatedly appearing among the bit lines BL1 to BL4. Accordingly, the memory pillars MP1*a* and MP1*b* connected to the word lines WLe7 and WLo7 (or the select gate line SGD) are connected to the bit line BL2.

Further, details of the bit lines BL connected to the plurality of memory pillars MP2*a*, MP2*b*, MP3*a*, MP3*b*, MP4*a*, and MP4*b* are the same as those of the first embodiment shown in FIG. 12.

2.2 Effects of Embodiments

According to the second embodiment, similar to the first embodiment, a semiconductor storage device capable of improving operation reliability and reducing a memory cell array region can be provided. In detail, it is possible to prevent calculation of the bit line control for selecting the bit line BL from becoming complicated during write and read operations. Further, an increase in the dummy region in which the slit region STH used in the replacement step such as the word line WL is provided can be prevented, and the memory cell array region can be reduced.

In addition, in FIGS. 4, 10, 11, 13, and the like, disposing the word line WLe and the word line WLo (or the select gate line SGD) in a comb shape from both ends in the X direction is merely an example, and other arrangement forms may be used.

In the above embodiments, a NAND flash memory is described as an example of a semiconductor storage device, and embodiments of the present disclosure is not limited to the NAND flash memory. The embodiments of the present disclosure is applicable to other semiconductor memories in general, and is applicable to various storage devices other than the semiconductor memories. In addition, in the flowchart described in the above embodiments, the order of the processing can be changed as much as possible.

While certain embodiments have been described, these embodiments have been presented by way of example only, and are not intended to limit the scope of the disclosure. Indeed, the embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
   a plurality of first conductive layers that are stacked in a first direction on a substrate and extend in a second direction intersecting the first direction;
   a plurality of second conductive layers that are stacked in the first direction on the substrate and extend in the second direction, the plurality of second conductive layers being separated from the plurality of first conductive layers in the second direction and a third direction intersecting the second direction;
   a plurality of third conductive layers extend in the third direction, one end of the plurality of third conductive layers electrically connected to the first conductive layers and the other end of the plurality of third conductive layers electrically connected to the second conductive layers and stacked in the first direction on the substrate;
   a first insulating layer and a second insulating layer that each extend in the first direction and the second direction and are arranged in the third direction, the first conductive layer between the first insulating layer and the second insulating layer;
   a third insulating layer and a fourth insulating layer that each extend in the first direction and the second direction and are arranged in the third direction, the second conductive layer between the third insulating layer and the fourth insulating layer;
   a first insulating region and a second insulating region that extend in the first direction and sandwich the plurality of third conductive layers;
   a plurality of first pillars that each extend in the first direction and are arranged in the second direction in the first insulating layer with a first pitch of a first distance; and
   a plurality of second pillars that each extend in the first direction and are arranged in the second direction in the second insulating layer with a second pitch of the first distance, wherein
   each of the plurality of second pillars is displaced from a corresponding one of the plurality of first pillars by a second distance that is shorter than a half of the first distance in the second direction.

2. The semiconductor storage device according to claim 1, wherein
   the second distance is one quarter of the first distance.

3. The semiconductor storage device according to claim 1, further comprising:
   a plurality of third pillars that each extend in the first direction and are arranged in the second direction in the fourth insulating layer with a third pitch of the first distance, wherein
   a center-to-center distance between an adjacent pair of one of the plurality of first pillars and one of the plurality of third pillars is 4.25 times the first distance.

4. The semiconductor storage device according to claim 1, wherein
   the first insulating region is disposed between an end portion of the first insulating layer and an end portion of the third insulating layer, and
   the second insulating region is disposed between an end portion of the second insulating layer and an end portion of the fourth insulating layer.

5. The semiconductor storage device according to claim 1, wherein
   the first insulating region is disposed in a fourth direction that intersects the first direction and is different from the second direction and the third direction, and
   the second insulating region is disposed in the fourth direction.

6. The semiconductor storage device according to claim 5, wherein
   an angle between the first insulating region and the first insulating layer is greater than 90 degrees, and an angle between the second insulating region and the second insulating layer is greater than 90 degrees.

7. The semiconductor storage device according to claim 1, wherein
each of the first insulating region and the second insulating region has an oval shape, a long axis direction of the first insulating region is disposed obliquely to the first insulating layer, and a long axis direction of the second insulating region is disposed obliquely to the second insulating layer.

8. The semiconductor storage device according to claim 1, wherein
each of the first insulating region and the second insulating region has an oval shape, a minor axis direction of the first insulating region is disposed obliquely to the first insulating layer, and a minor axis direction of the second insulating region is disposed obliquely to the second insulating layer.

9. The semiconductor storage device according to claim 1, wherein
each of the first insulating region and the second insulating region has an oval shape, and a long axis direction of the first insulating region and the second insulating region is disposed in the third direction.

10. The semiconductor storage device according to claim 1, wherein
the first pillars and the second pillars each have a semiconductor layer that extends in the first direction.

11. The semiconductor storage device according to claim 1, further comprising:
a plurality of fourth pillars that each extend in the first direction and are arranged in the second direction in the third insulating layer with a pitch of the first distance; and
a plurality of bit lines provided above the first pillars and the fourth pillars, wherein
the bit lines electrically connected to the first pillars and the fourth pillars have the same attribute.

12. The semiconductor storage device according to claim 1, wherein
an intersection of one of the plurality of first conductive layers and one of the plurality of first pillars functions as a memory cell transistor.

13. A semiconductor storage device comprising:
a first memory trench extending in a first lateral direction;
a second memory trench extending in the first lateral direction, wherein the first memory trench and the second memory trench, along a second lateral direction perpendicular to the first lateral direction, sandwich a plurality of conductive layers stacked on top of another;
a plurality of first memory pillars that are disposed in the first memory trench and are spaced from one another in the first lateral direction with a first distance; and
a plurality of second memory pillars that are disposed in the second memory trench and are spaced from one another in the first lateral direction with a first distance, wherein
each of the plurality of second memory pillars is displaced from a corresponding one of the plurality of first memory pillars by a second distance that is shorter than a half of the first distance in the first lateral direction.

14. The semiconductor storage device according to claim 13, wherein
the second distance is one quarter of the first distance.

15. The semiconductor storage device according to claim 13, further comprising:
a first slit region separating the first memory trench; and
a second slit region separating the second memory trench.

16. The semiconductor storage device according to claim 15, wherein each of the first slit region and second slit region extends in a third lateral direction different from the first lateral direction and from the second lateral direction.

17. The semiconductor storage device according to claim 16, each of the first slit region and the second slit region has an oval shape, a long axis direction of the first slit region is disposed obliquely to the first memory trench, and a long axis direction of the second slit region is disposed obliquely to the second memory trench.

18. The semiconductor storage device according to claim 16, each of the first slit region and the second slit region has an oval shape, a minor axis direction of the first slit region is disposed obliquely to the first memory trench, and a minor axis direction of the second slit region is disposed obliquely to the second memory trench.

19. The semiconductor storage device according to claim 13, each of the first memory pillars and the second memory pillars has a semiconductor layer.

* * * * *